United States Patent
Ludwig

(10) Patent No.: US 8,531,251 B2
(45) Date of Patent: *Sep. 10, 2013

(54) THROUGH-ZERO PULSE-WIDTH MODULATION PROCESS WITH PERIOD-AVERAGE-ZERO

(75) Inventor: Lester F. Ludwig, Belmont, CA (US)

(73) Assignee: Pike Group LLC, Dover, DE (US)

( * ) Notice: Subject to any disclaimer, the term of this patent is extended or adjusted under 35 U.S.C. 154(b) by 1 day.

This patent is subject to a terminal disclaimer.

(21) Appl. No.: 12/941,379

(22) Filed: Nov. 8, 2010

(65) Prior Publication Data

US 2012/0056688 A1    Mar. 8, 2012

Related U.S. Application Data

(63) Continuation of application No. 12/144,480, filed on Jun. 23, 2008, now Pat. No. 7,830,219.

(60) Provisional application No. 60/964,468, filed on Aug. 11, 2007, provisional application No. 60/937,022, filed on Jun. 24, 2007.

(51) Int. Cl.
*H03K 7/08*    (2006.01)

(52) U.S. Cl.
USPC .......................................... 332/109; 327/131

(58) Field of Classification Search
USPC ........................................ 332/109; 327/131
See application file for complete search history.

(56) References Cited

U.S. PATENT DOCUMENTS

| 5,267,344 | A | 11/1993 | Nelson, III |
| 8,115,563 | B2* | 2/2012 | Odagiri .......................... 332/109 |
| 8,289,097 | B2* | 10/2012 | Putzeys .......................... 332/106 |
| 2012/0032748 | A1* | 2/2012 | Li et al. ......................... 332/109 |

OTHER PUBLICATIONS

CEM3394 microprocessor controllable synthesizer chip product data sheet, Dec. 1983, downloaded from http://www. datasheetarchive. com/datasheet-pdf/Scans-007/Scans-00158551.ht- ml, accessed on Jul. 14, 2010, 9 pages.

* cited by examiner

*Primary Examiner* — Joseph Chang

(57) ABSTRACT

New methods for generating through-zero pulse-width modulation are disclosed. In one approach, a periodic reference signal varies over time over at least one portion of the period. A pulse-width control signal varies linearly with time over at least one portion of the reference signal. The reference signal is compared with the pulse-width control value to produce a first pulse waveform. The value of a function of the control value is subtracted from the first pulse waveform to produce through-zero pulse-width modulation. In another approach, the difference in value between two ramp or sawtooth periodic waveforms is computed to produce a pulse waveform with a time-varying DC offset that varies linearly in time. The time-varying offset-term is retained with the pulse waveform, producing through-zero pulse-width modulation.

25 Claims, 23 Drawing Sheets

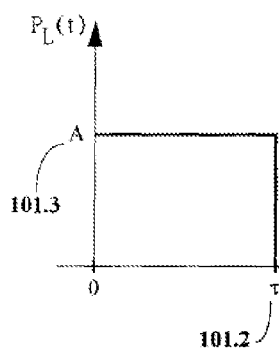
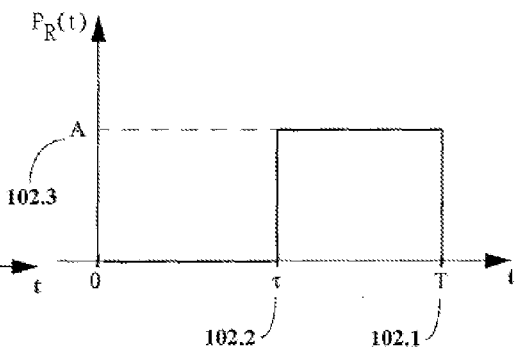
Figure 1a          Figure 1b
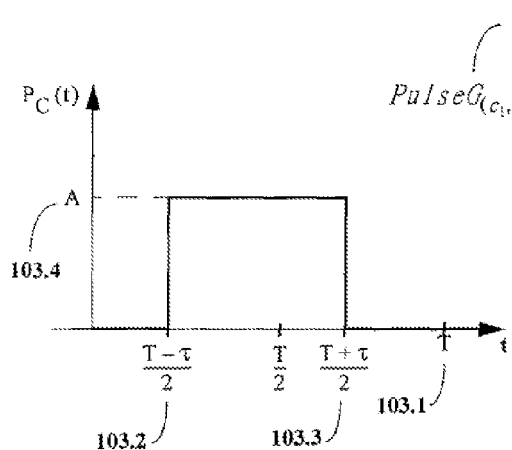
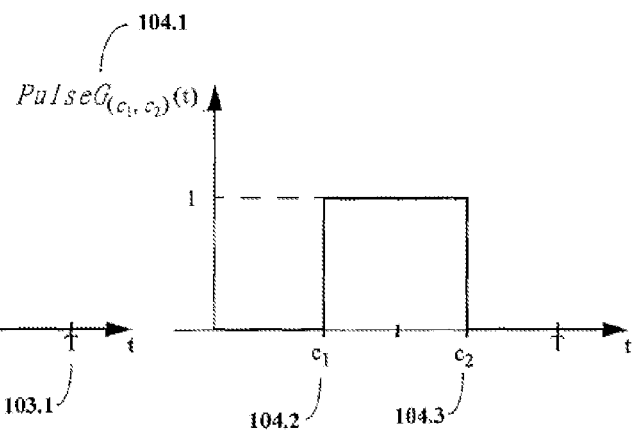
Figure 1c          Figure 1d Figure 10d $\left[-\frac{1}{2} \leq c \leq \frac{1}{2}\right]$ Figure 10e $\left[-\frac{A}{2} \leq c \leq \frac{A}{2}\right]$ Figure 10f $[0\% \leq d \leq 100\%]$

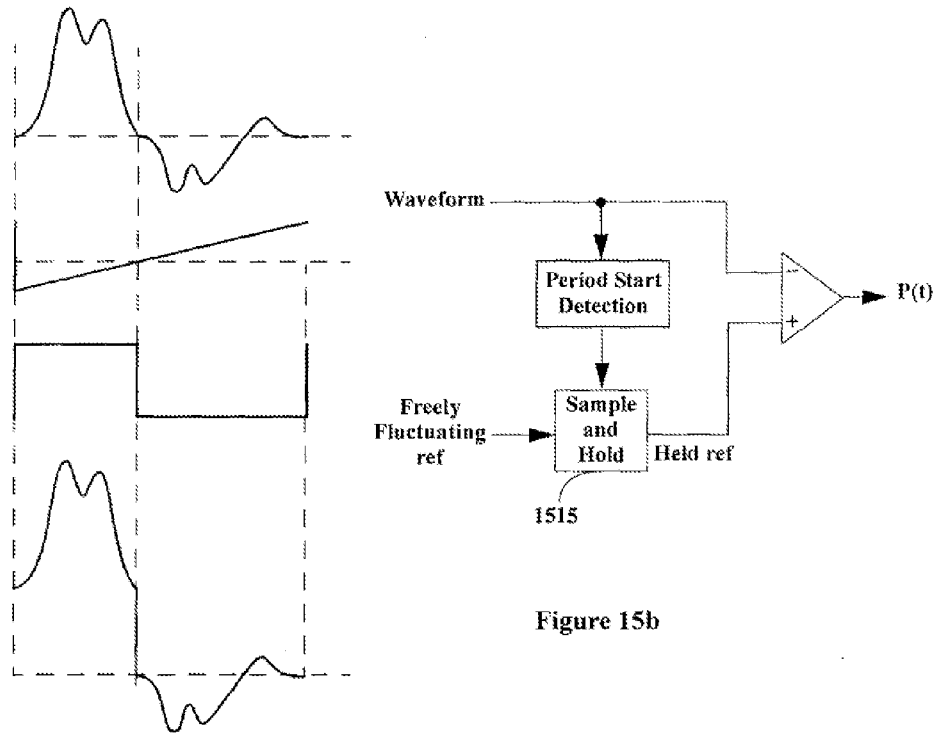
Figure 15b
Figure 15a
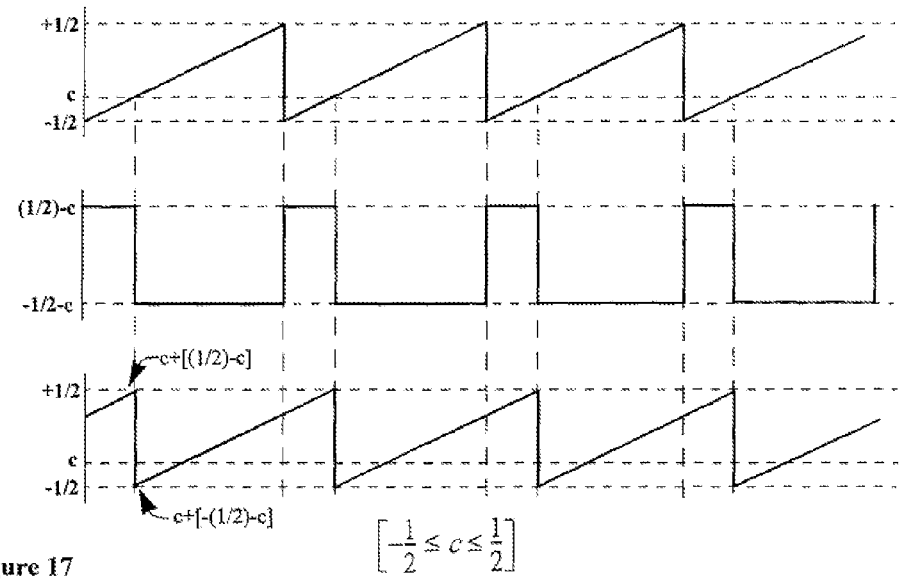
Figure 17

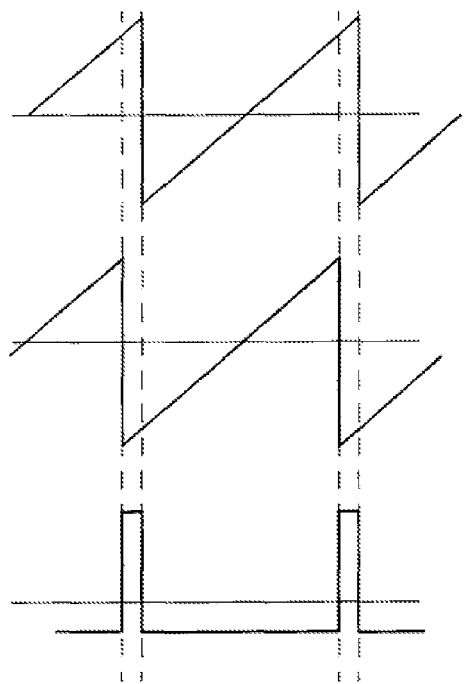
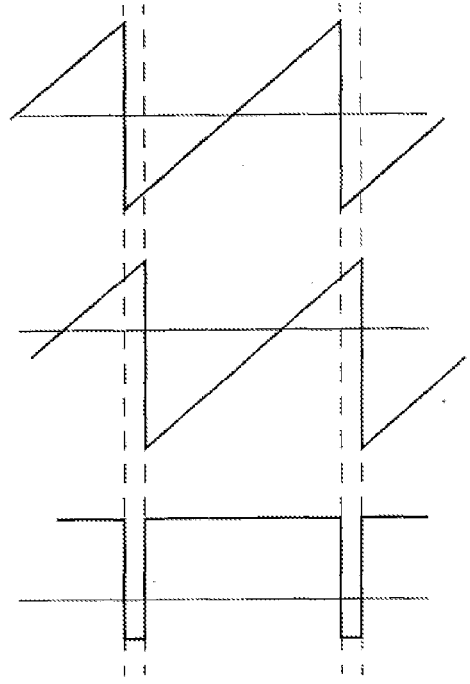
Figure 19a    Figure 19b
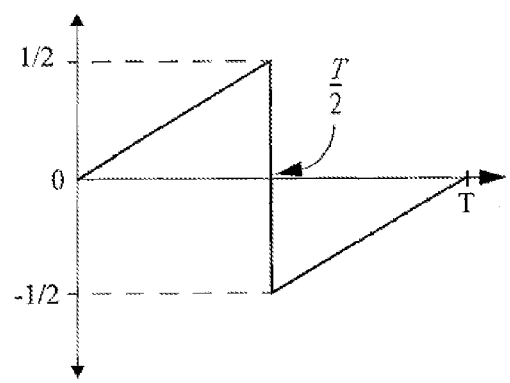
Figure 19c

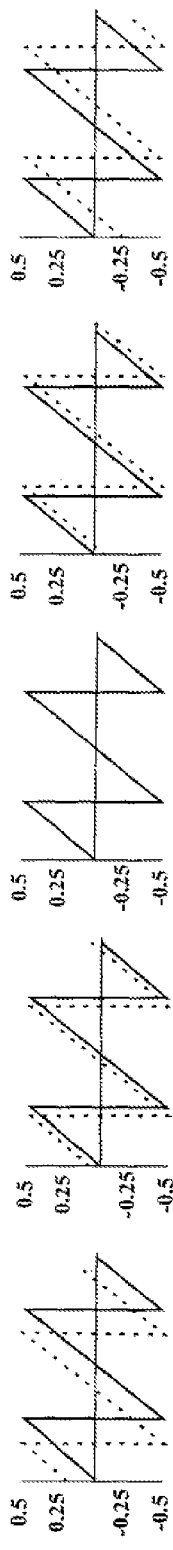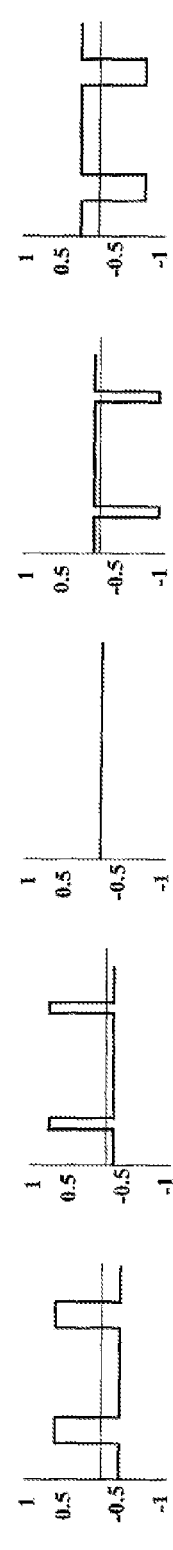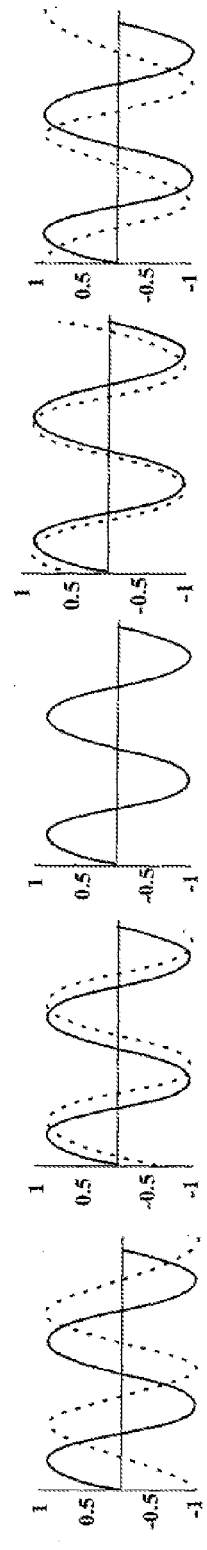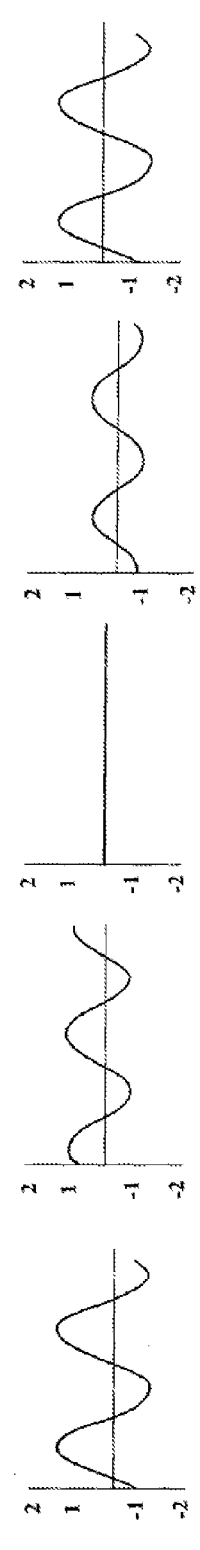
Figure 20a  Figure 20b  Figure 20c  Figure 20d  Figure 20e
Figure 21a  Figure 21b  Figure 21c  Figure 21d  Figure 21e

THROUGH-ZERO PULSE-WIDTH MODULATION PROCESS WITH PERIOD-AVERAGE-ZERO

CROSS-REFERENCE TO RELATED APPLICATIONS

This application is a continuation of U.S. patent application Ser. No. 12/144,480, now U.S. Pat. No. 7,830,219, filed on Jun. 23, 2008, and pursuant to 35 U.S.C. §119(e), which claims benefit of priority from provisional patent application Ser. No. 60/937,022, filed Jun. 24, 2007 and Ser. No. 60/964,468 filed Aug. 11, 2007, the contents of each are hereby incorporated by reference herein in their entirety.

BACKGROUND OF THE INVENTION

1. Field of the Invention

The present invention generally relates to signal processing and waveform generation and in particular to attributes and generation of pulse-width modulation waveforms.

2. Background of the Invention

Pulse-width modulation (PWM) of a temporal signal waveform of fixed amplitude finds wide use in many applications including motor control, communication systems, music synthesizers, power supplies, class-D and digital amplifiers, to name a few. The Fourier series expansion of each period of a pulse width modulated waveform typically includes an otherwise non-sinusoidal additive term that is a function of the pulse width in that period. As the pulse width is varied, this additive term varies, which can be problematic in many applications.

SUMMARY OF THE INVENTION

Features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

A pulse waveform having a zero d.c. term in each period of a periodic reference signal is generated. A pulse width control signal varies linearly over at least one portion of the reference signal. The reference signal is compared with the pulse width control value to produce a first pulse waveform. A function of the control signal is subtracted from the first pulse waveform to produce a second pulse waveform, and this second pulse waveform is provided as an output signal. This output signal has a through-zero pulse-width average value over the reference signal period of zero.

The function of the control signal is a linear function, and affine function, or an inverse trigonometric function. The function of the control signal is subtracted from the reference signal using either an analog or a digital circuit.

These and other embodiments will also become readily apparent to those skilled in the art from the following detailed description of the embodiments having reference to the attached figures, the invention not being limited to any particular embodiment disclosed.

BRIEF DESCRIPTION OF THE DRAWINGS

The above and other aspects, features, and advantages of the present invention will become more apparent upon consideration of the following description of preferred embodiments, taken in conjunction with the accompanying drawing figures.

FIGS. 1a through 1d depict various types of exemplary simple single-pulse periodic waveforms, each comprising various pulse width attributes applicable to modulation.

FIG. 10d depicts an exemplary left-anchored pulse waveform with zero d.c. term of unit amplitude. The pulse width is determined by the value of the control signal value c.

FIG. 10e shows the affairs depicted in FIG. 10d scaled by an exemplary positive constant A.

FIG. 10f shows an exemplary rendering of FIG. 10e expressed in terms of pulse width duty cycle d.

FIG. 15a depicts exemplary undesired effects resulting from rapidly changing reference signals.

FIG. 15b depicts an exemplary method of addressing the situations associated with FIG. 15a by introducing a sample-and-hold operation that samples at the beginning of each period.

FIG. 17 depicts how a pulse generated from an exemplary reference ramp waveform by a comparator or equivalent operation, when subtracted from that reference ramp waveform, results in a phase shifted version of the reference ramp waveform.

FIGS. 19a and 19b depicts how "through-zero" pulse width modulation can be obtained from the difference of two versions of an exemplary ramp waveform which differ by a phase shift. FIG. 19c depicts an exemplary time-shifted ramp waveform with discontinuity at the center of the period rather than at the edges of the period.

FIGS. 20a through 20e depict "through-zero" pulse width modulation obtained from the difference of two versions of an exemplary ramp waveform which differ by selected phase shifts.

FIGS. 21a through 21e depict amplitude modulated sinusoidal waveforms obtained from the difference of two versions of an exemplary sinusoidal waveform which differ by the same selected phase shifts as used in FIGS. 20a through 20e. Comparison of FIGS. 20a through 20e and FIGS. 21a through 21e can be used to show analogies between "through-zero" pulse width modulation resulting from the subtraction of two ramp waveforms of slightly different frequencies and "beat frequency" processes resulting from the subtraction of two sinusoidal waveforms of slightly different frequencies.

FIGS. 23a through 2c depict relationships between symmetry modulated triangle waves and corresponding zero d.c. term pulse waveforms for various pulse widths. The symmetry modulated triangle waves and corresponding zero d.c. term pulse waveforms are related by time integrals and time derivatives.

DETAILED DESCRIPTION OF THE PREFERRED EMBODIMENTS

Figure 2A:
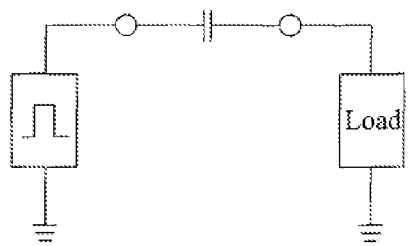
FIGS. 2a through 2c depict exemplary realizations and effects of capacitive coupling on pulse waveforms. The depicted effects become more pronounced at lower waveform frequencies and less pronounced at higher waveform frequencies.

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

FIGS. 1a-1c illustrate three exemplary types of fixed amplitude pulse waveforms of a fixed frequency as commonly used in industry, design, and theory in conjunction with pulse width modulation. Many other variations are possible as is clear to one skilled in the art (e.g., negative-going, different temporal centering, different amplitude centering, etc.).

FIG. 1a shows one period of temporal duration T 101.1 for a variable-width pulse $P_L(t)$ with a (left-anchored) rising edge at a fixed point at the temporal beginning (0) of the period and falling edge of variable location at a later point ($\tau$ 101.2) in the periodic interval (length T). In general the amplitude A 101.3 of such a pulse may take on any positive value. One common canonical form is, with A=1, which typically includes a need for detail accounting of the variable location point $\tau$, so it will be useful to define $PulseL_\tau(t)$ as $P_L(t)$ with A=1. The ratio of the temporal duration of non-zero value, $\tau/T$, is called the duty cycle, denoted here for the left-anchored pulse as $d_L$ and given as a percentage:

$$d_L = \tau/T\, 100\%$$

For $P_L(t)$ with amplitude A, the long-term time-average value of the waveform is thus $A\tau/T$ and the long-term time-average value of (unit amplitude) $PulseL_\tau(t)$ is $\tau/T$. Thus for a given pulse width, this long-term time-average value varies proportional to the pulse width. Thus as the pulse width is varied, the short-term time-average value, or more precisely the average value of the waveform over a complete period, varies proportionally to the pulse width, here proportionally with the value of τ.

FIG. 1b shows one period of temporal duration T 102.1 for a variable-width pulse $P_R(t)$ with a (right-anchored) rising edge a rising edge of variable location at some point past the beginning of the periodic interval (τ 102.2) and falling edge at a fixed point at the end of the periodic interval (length T). In general the amplitude A 102.3 may take on any positive value. In a manner similar to that above, $PulseR_τ(t)$ will be defined as $P_R(t)$ with amplitude 1. The ratio of the temporal duration of non-zero value, τ/T, is called the duty cycle, denoted here for the right-anchored pulse as $d_R$ and given as a percentage:

$$d_R = (T-τ)/T\ 100\%$$

If the amplitude of such a pulse is A, the long-term time-average value of $P_R(t)$ is $A(T-τ)/T$. Thus, the long-term time-average value of (unit amplitude) $PulseR_τ(t)$ is $(T-τ)/T$. Hence for a given pulse width, this long-term time-average value varies proportionally to the pulse width. Thus as the pulse width is varied, the short-term time-average value, or more precisely the average value of the waveform over a complete period, varies proportional to the pulse width, here proportionally with the value of $(T-τ)$.

Note that the sum of these two periodic waveforms $PulseL_τ(t) + PulseR_τ(t)$, if both are of the same amplitude and have equal values of τ, is effectively a constant. Formally the discontinuities at the period boundaries . . . , 0, T, 2T, 3T, . . . and at . . . , τ, τ+T, t+2T, τ+3T, . . . cancel one another when added in this way. Thus either of these pulse waveforms may be created from the other; for example if both have unit amplitude:

$$PulseL_τ(t) = 1 - PulseR_τ(t)$$

$$PulseR_τ(t) = 1 - PulseL_τ(t)$$

FIG. 1c shows one period of temporal duration T 103.1 for a variable-width pulse $P_c(t)$ with a (center-anchored) rising edge at a variable location point, $(T-τ)/2$ 103.2, occurring after the beginning of the period but before the center of the periodic interval, and a falling edge at the symmetrically variable location, $(T-τ)/2$ 103.3, at a later point in the periodic interval. In general the amplitude A may take on any positive value. This is often set to 1, so $PulseL_C(t)$ will be defined as $P_C(t)$ with amplitude 1. The ratio of the temporal duration of non-zero value, τ/T, is called the duty cycle, denoted here for the Center-anchored pulse as $d_L$ and given as a percentage:

$$d_c = 100\%\ τ/T$$

If the amplitude of such a pulse is A 103.4, the long-term time-average value of the waveform is Aτ/T. Thus, the long-term time-average value of (unit amplitude) $PulseC_τ(t)$ is τ/T. Thus for a given pulse width, this long-term time-average value varies proportional to the pulse width. Thus as the pulse width is varied, the short-term time-average value, or more precisely the average value of the waveform over a complete period, varies proportional to the pulse width, here proportionally with the value of τ.

The average value of the waveform over a complete period may also be viewed as the constant term of a Fourier series for a periodic waveform that repeats that periodic segment indefinitely. The Fourier series for a given periodic waveform represents the waveform as a weighted sum of fixed sinusoids (quadrature sine/cosine or phase-shifted) or complex exponentials, each of which whose frequencies are integer multiples of the frequency of the given periodic waveform. The Fourier series for each of these can be calculated individually, but also may be treated as special cases of the general pulse wave pulse $PulseG_{(c1,c2)}(t)$ 104 depicted in FIG. 1d. In that waveform, the parameter constraints 104.2, 104.3 are:

$$0 \leq c_1 \leq c_2 \leq T.$$

The trigonometric Fourier series for this waveform is obtained as follows, leveraging the fact that the waveform is piecewise-constant periodically taking on a value of either zero of A:

$$a_0 = \frac{2}{T} \int_{c_1}^{c_2} A\, dx = \frac{2Ax}{T} \Big|_{c_1}^{c_2} = \frac{2A}{T}(c_2 - c_1)$$

$$a_n = \frac{2}{T} \int_{c_1}^{c_2} A \cos =$$

$$\left(\frac{2\pi n x}{T}\right) dx = \frac{2A}{T} \frac{\sin\left(\frac{2\pi n x}{T}\right)}{\left(\frac{2\pi N}{T}\right)} \Bigg|_{x=c_1}^{x=c_2} = \frac{A}{n\pi}\left[\sin\left(\frac{2n\pi c_2}{T}\right) - \sin\left(\frac{2n\pi c_1}{T}\right)\right]$$

$$b_n = \frac{2}{T} \int_{c_1}^{c_2} A \sin\left(\frac{2\pi n x}{T}\right) dx = \frac{2A}{T}\left(\frac{-\cos\left(\frac{2\pi n x}{T}\right)}{\left(\frac{2\pi n}{T}\right)}\right)\Bigg|_{x=c_1}^{x=c_2}$$

$$= \frac{-A}{n\pi}\left[\cos\left(\frac{2n\pi c_2}{T}\right) - \cos\left(\frac{2n\pi c_1}{T}\right)\right]$$

$$= \frac{A}{n\pi}\left[\cos\left(\frac{2n\pi c_1}{T}\right) - \cos\left(\frac{2n\pi c_2}{T}\right)\right]$$

$$PulseG_{(C1,C2)}(τ) = \frac{a_0}{2} + \sum_{n=1}^{\infty}\left[a_n \cos\left(\frac{2n\pi c_1}{T}\right) + b_n \sin\left(\frac{2n\pi c_2}{T}\right)\right] =$$

$$A\left(\frac{c_2 - c_1}{T}\right) + \frac{A}{\pi}\sum_{n=1}^{\infty}\frac{1}{n}\left[\left[\sin\left(\frac{2n\pi c_2}{T}\right) - \sin\left(\frac{2n\pi c_1}{T}\right)\right]\right.$$

$$\left.\cos\left(\frac{2n\pi t}{T}\right) + \left[\cos\left(\frac{2n\pi c_1}{T}\right) - \cos\left(\frac{2n\pi c_2}{T}\right)\right]\sin\left(\frac{2n\pi t}{T}\right)\right]$$

Thus the Fourier series for the unit amplitude periodic left-anchored pulse waveform depicted in FIG. 1a which has:

$$A=1, c_1=0$$

and $$c_2=τ$$

is given by:

$$PulseL_τ(t) =$$

$$\frac{τ}{T} + \frac{1}{\pi}\sum_{n=1}^{\infty}\frac{1}{n}\left[\sin\left(\frac{2n\pi τ}{T}\right)\cos\left(\frac{2n\pi t}{T}\right) + \left(1 - \cos\left(\frac{2n\pi τ}{T}\right)\right)\sin\left(\frac{2n\pi t}{T}\right)\right]$$

Similarly, the series for the unit amplitude periodic right-anchored pulse waveform depicted in FIG. 1b which has:

$$A=1, c_1=τ$$

and $$c_2=T$$

is given by:

$$PulseR_\tau(t) = \frac{T-\tau}{T} - \frac{1}{\pi}\sum_{n=1}^{\infty}\frac{1}{n}\left[\sin\left(\frac{2n\pi\tau}{T}\right)\cos\left(\frac{2n\pi t}{T}\right) + \left(1-\cos\left(\frac{2n\pi\tau}{T}\right)\right)\sin\left(\frac{2n\pi t}{T}\right)\right]$$

and the Fourier series for the unit amplitude periodic Center-anchored pulse waveform depicted in FIG. 1c which has:

$$A = 1,\ c_1 = \frac{(T-\tau)}{2},\ \text{and}\ c_2 = \frac{(T+\tau)}{2}$$

is given by:

$$PulseC_\tau(t) = \frac{\tau}{T} - \frac{2}{\pi}\sum_{n=1}^{\infty}\frac{1}{n}\left[(-1)^n\sin\left(\frac{n\pi\tau}{T}\right)\cos\left(\frac{2n\pi t}{T}\right)\right]$$

because of the following relationship:

$$\sin\left(\frac{2n\pi c_2}{T}\right) - \sin\left(\frac{2n\pi c_1}{T}\right) = \sin\left[\frac{2n\pi}{T}\left(\frac{(T+\tau)}{2}\right)\right] -$$
$$\sin\left[\frac{2n\pi}{T}\left(\frac{(T-\tau)}{2}\right)\right]$$
$$= \sin\left[n\pi + \left(\frac{n\pi\tau}{T}\right)\right] - \sin\left[n\pi - \left(\frac{n\pi\tau}{T}\right)\right]$$
$$= (-1)^n\sin\left(\frac{n\pi\tau}{T}\right) - (-1)^n\sin\left(-\frac{n\pi\tau}{T}\right)$$
$$= 2(-1)^n\sin\left(\frac{n\pi\tau}{T}\right)$$

and $$\cos\left(\frac{2n\pi c_1}{T}\right) - \cos\left(\frac{2n\pi c_2}{T}\right) = \cos\left[\frac{2n\pi}{T}\left(\frac{(T-\tau)}{2}\right)\right] -$$
$$\cos\left[\frac{2n\pi}{T}\left(\frac{(T+\tau)}{2}\right)\right]$$
$$= \cos\left[n\pi - \left(\frac{n\pi\tau}{T}\right)\right] - \cos\left[n\pi + \left(\frac{n\pi\tau}{T}\right)\right]$$
$$= (-1)^n\cos\left(\frac{n\pi\tau}{T}\right) - (-1)^n\cos\left(-\frac{n\pi\tau}{T}\right)$$
$$= (-1)^n\left(\cos\left(\frac{n\pi\tau}{T}\right) - \cos\left(\frac{n\pi\tau}{T}\right)\right)$$
$$= 0$$

For each set of value parameters, the associated pulse waveform has a "constant" or "d.c." term proportional to the temporal amplitude, period, and width (or duty cycle) of the pulse. Thus as the pulse width is varied, this "d.c." term itself varies proportional to the non-zero width of the pulse. It is to this "constant" or "d.c." term that several embodiments of the invention are addressed.

In many applications, the variation in the short-term time-average value, average value of the waveform over a complete period, and Fourier series d.c. term can be problematic, causing saturation of magnetic components (such as transformers, inductors, and transducers), saturation of amplifier stages, audio "pops" when signals are switched or gain is changed rapidly in audio-frequency applications, undesired modulation product components in arrangements when the PWM waveform is modulated or used as. a modulating signal, etc.

Reflecting this, various approaches have been used to remove the d.c. term to create a "zero-centered" or "zero-average" pulse waveform, and in particular when the pulse width is time-varying. These approaches include capacitive coupling, arrangements involving alternate positive-going and negative-going pulses, and "D.C.-restore" techniques.

Figure 2B:
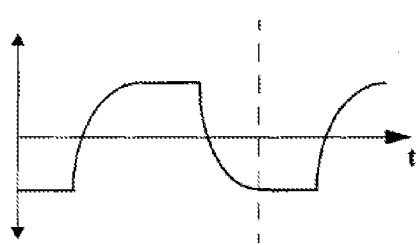
Figure 2C:
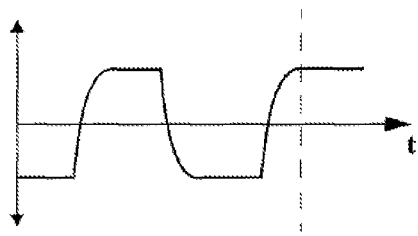

An arrangement for capacitive coupling is depicted in FIG. 2a. Although useful for some applications, this approach can introduce a number of problems. For real-valued (pure-resistive) loads, exponential transient rounding is imposed on the corners as shown in FIGS. 2b and 2c, reflecting the well-known exponential step-response of an RC circuit. In the extreme case, where the frequency of the periodic pulse waveform is such that the period is comparable to an effective RC time-constant, the corner rounding distortion depicted in FIG. 2b will result. If the frequency of the periodic pulse waveform is considerably higher, this RC step-response corner rounding distortion can be diminished, but nonetheless will remain present, introducing a contribution to performance error in many situations.

Figure 3A:
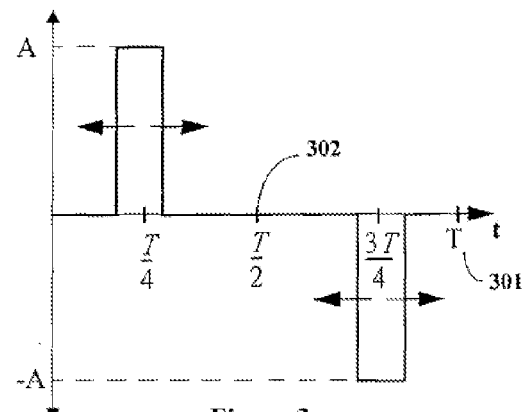
FIGS. 3a through 3c depict various types of exemplary double-pulse periodic waveforms, each comprising various pulse width attributes applicable to modulation. The positive/negative amplitude symmetry of these waveforms naturally gives rise to a zero d.c. term during each period.
Figure 3B:
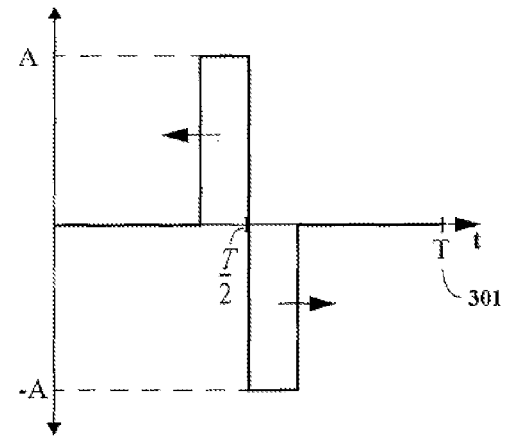
Figure 3C:
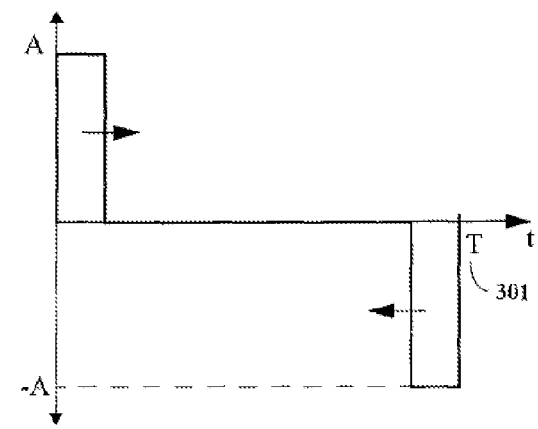

The use of alternate positive-going and negative-going pulses (also called "bipolar" and "alternate-mark" pulses) is depicted in FIG. 3a-3c. In each of these, the areas of positive-going and negative-going pulses comprised in one waveform period are arranged to be equal. For example, in an exemplary pulse width modulation system, one period of a waveform comprises one positive-going pulse and one negative-going pulse, each of equal amplitude and duration. The waveforms of FIGS. 3a, 3b, and 3c differ as to the centering and anchoring of the positive and negative pulses. In this family of examples, the period of length T 301 is divided into consecutive two sub-periods each of length T/2 302.

FIG. 3a depicts an approach where the pulses in each sub-period are anchored at the centers of the sub-periods (i.e., center-anchored at T/4 and 3T/4) and the pulse width symmetrically varies on each side of these centered-anchors. FIG. 3b depicts an approach where the pulses in each sub-period are anchored at the centers of the overall period (i.e., one pulse right-anchored at T/2 and the other pulse left-anchored at T/2) with the pulse widths are varied on only the non-anchored sides. FIG. 3c depicts an approach where the pulses in each sub-period are anchored at the centers of the overall period (i.e., one pulse left-anchored at 0 and the other pulse right-anchored at T) with the pulse widths are varied on only the non-anchored sides. Other variations of this approach are found in literature and practice as is familiar and/or clear to one skilled in the art. Unlike capacitive coupling, this called "bipolar"/"alternate-mark" pulse waveform design has built in to its very structure a zero average value over the period of the waveform.

Although such pulse waveform design finds many applications in communications (for example in Manchester and Alternate Mark Inversion digital stream encoding used in T-carrier and ISDN loops) and some motor control situations, it clearly may not be at all useful in many applications, especially where a binary waveform (i.e., pulse-waveform comprising only two values) is required.

In a "D.C.-restore" technique, rarely if ever employed, a temporal averaging circuit may be used to measure the short-term average value of a provided periodic pulse waveform or pulse-width modulation waveform and subtract this measured average from the provided pulse waveform or pulse-width modulation waveform. Although conceptually useful for some applications, such as those involving synchronization signals, this approach suffers from transient effects induced on the d.c. term due to the transient response of temporal averaging circuits. Thus, each of these methods for dealing with d.c terms in either static or time-varying pulse widths could benefit from further improvement.

Overview

Embodiments of the present invention are directed towards the forgoing and other applications resulting from novel approaches. Some aspects of the invention are directed to the creation of per-period binary-value "zero-dc" pulse waveforms that naturally have a zero average value over the period of the waveform. In many cases the width of the pulse can be directly related to the d.c. term that pulse width would produce, allowing the direct synthesis of a value that can be subtracted out.

Before describing the provided figures in detail, some additional discussion is provided regarding the generation of periodic pulse and pulse-width modulation waveforms from a source periodic waveform and a fixed or time-varying control signal. A number of these approaches are currently not found in conventional systems.

Figure 4A:
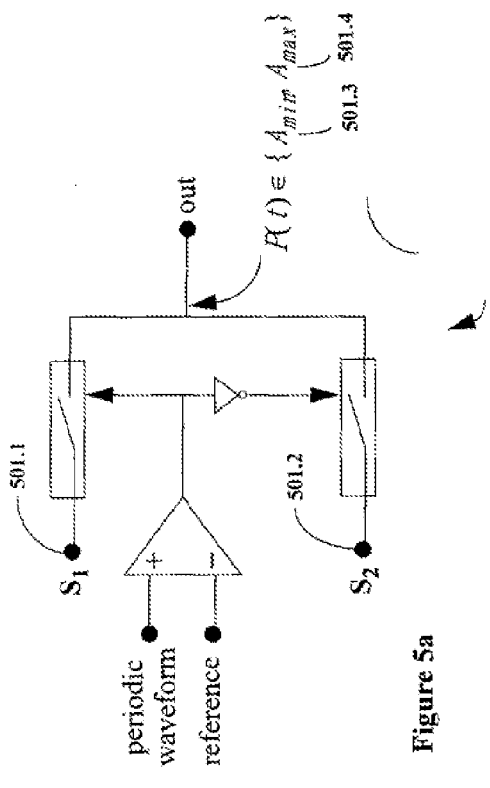
FIGS. 4a and 4b depict various types of exemplary electronic circuit realizations of circuits for creating pulse width modulated waveform from a provided suitably-varying periodic waveform and provided control signal wherein the control signal amplitude controls the pulse width of the resultant output waveform.

In a commonly used electronic circuit approach generation of periodic pulse and pulse-width modulation waveforms from a source periodic waveform, a comparator (in fact often an op amp used as a comparator) is employed to compare a source periodic waveform (such as a ramp, triangle, or sine wave) with a fixed or time-varying control signal. The comparator function output is designed to saturate into one of two extreme values. Such an arrangement obtained by the simplest employment of an op amp is depicted in FIG. 4a. In a simple exemplary arrangement involving a standard voltage-input voltage-output opamp, 401.1 the extreme output values ($A_{min}$ 401.4 and $A_{max}$ 401.5), are "near," for example, within a few diode drops, of the power supply voltages ($V_{neg}$ 401.3 and $V_{pos}$ 401.2, respectively) provided to the op amp.

Because of the high gain of the op amp, the op amp output will typically saturate at a minimum value $A_{min}$ 401.4 when the reference voltage applied to the inverting input of the op amp exceeds the value of the voltage of the periodic waveform 401.6 applied to the non-inverting terminal of the op amp. Similarly, the high gain of the op amp forces the op amp output to saturate at a maximum value $A_{max}$ 401.5 when the value of the voltage of the periodic waveform applied to the non-inverting terminal of the op amp exceeds the reference voltage 401.7 applied to the inverting input of the op amp. For op amps with high enough voltage gain, voltage differences where the op amp output is not saturated is quite limited and rapid rise and fall times will result from all but the slowest and/or smallest differences between the reference voltage 401.7 and voltage of the periodic waveform 401.6.

Similar types of arrangements and results may be obtained for current-input voltage-output op amps (such as the LM339 Norton op amp), voltage-input current-output trans conducting op amps (such as the CA3080), and other such high-gain/high-transconductance/high-transresistance amplifier structures. However, drawbacks exist with regard to this 'raw op amp comparator' approach. Such high-gain amplifiers structures can latch-up, be slowed, or made asymmetric by parasitic capacitive and other effects. Slew rates of the op amp and lower open-loop gain values can add appreciable slope to the resultant pulse waveform transition edge. Variation in power supply voltages and thermal drift can change the values of the extreme (saturating) output voltage values, and the large swings can create noise signals, waste electrical power, and can add to the component count when attenuation or improved waveform definition is required.

Figure 4B:
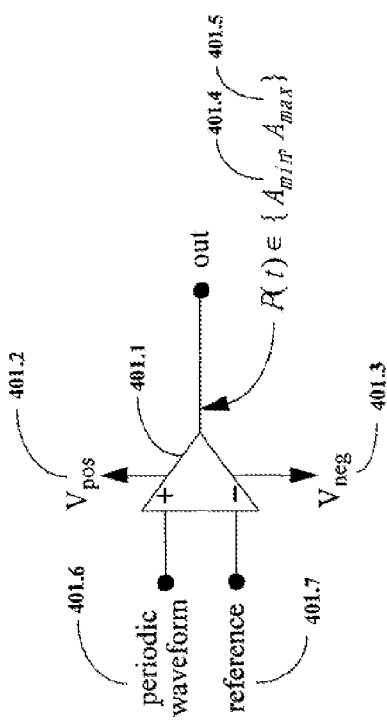

In other electronic comparator circuits, such as that embodied in the well-known LM311 comparator chip 402.1 depicted in FIG. 4b, are further designed to allow one or both of the output voltage extremes to be somewhat adjustable. In this approach the output structure has an open-collector style output requiring a pull-up resistor 402.2 (or similar function circuit).

Assuming the output is unloaded, this pull-up structure can be used to directly set the $A_{max}$ value 402.3 of the output as nearly the applied pull-up voltage (for a loaded-down output, the pull-up structure still sets the $A_{max}$ value but more complex voltage divider and/or current divider effects are imposed). The LM311 comparator chip provides a separate voltage input (pin 1) 402.4 for setting the lower voltage value $A_{min}$ 402.5 to a value nearly that of the voltage applied to that pin. Other variations of this approach are found in literature, products, and practice as is familiar and/or clear to one skilled in the art. Additionally comparators may be realized numerically, for example using logical tests, in algorithms as will be described.

Figure 5A:
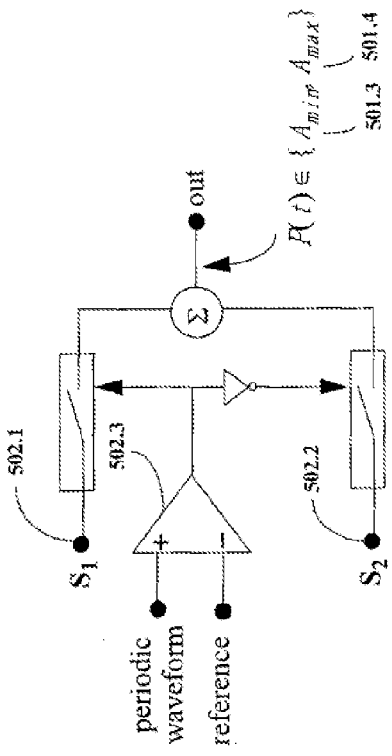
FIGS. 5a and 5b depicts an exemplary implementation employing the notation typically employed for analog voltage switching elements such as those realized by the CD4016, CD4066, and many other analog switching integrated circuits.
Figure 5B:
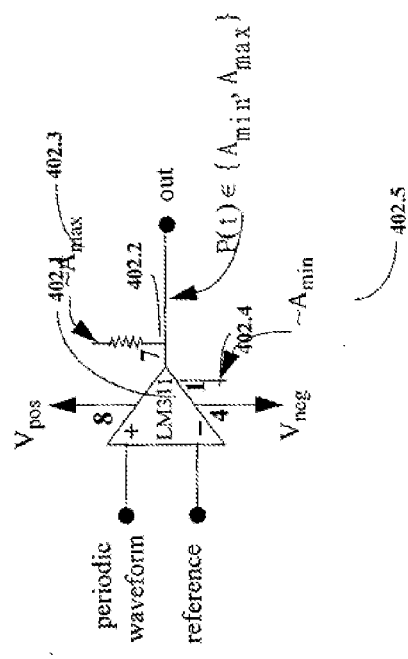

In another approach, either of these, or other comparator implementations, is used to control a complementary set of switches, for example analog switches or switching transistors. FIGS. 5a and 5b depicts an exemplary implementation employing the notation typically employed for analog voltage switching elements such as those realized by the CD4016, CD4066, and many other analog switching integrated circuits. Here the comparator output is not used directly as an output signal but rather is used to turn on one analog switch while turning off the other. The two switches may be connected to two different voltages, currents, or other signals. In one exemplary arrangement, $S_1$ 501.1 and $S_2$ 501.2 may be connected to a voltage source providing voltage $A_{min}$ 501.3 and $S_2$ may be connected to a voltage source providing voltage $A_{max}$ 501.4. The arrangement of FIG. 5a (and FIG. 5b to be discussed shortly) is much more general, however. $S_1$ 501.1 and $S_2$ 501.2 may comprise electrical currents, or may be periodic carrier signals, data signals, time-varying signals with differing amplitudes or phase, etc. Additionally the comparators, switching elements, and $S_1$ and $S_2$ may be realized numerically for example using logical conditional (IF-THEN-ELSE) statements, in algorithms as will be later described.

Further, by utilizing various types of switching elements (in place of those depicted as analog voltage switching elements such as those realized by the CD4016, CD4066), $S_1$ and $S_2$ may be more general types of electrical, optical, fluidic, pneumatic, charge, spin, magnetic, acoustic, chemical or biochemical, etc., signals or phenomena. These many variations may be implemented in accordance with various embodiments. Accordingly, the switching elements would respectively be electrical switching elements, optical switching elements, pneumatic switching elements, charge-transfer switching elements, spin-transfer switching elements, magnetic switching elements, acoustic switching elements, chemical or biochemical signal transduction mixing element, etc.

Additionally, the switch interconnection terminal may not be directed to a signal sink but rather to a signal source, bidirectional element, transmission line, or other arrangement, and similarly either or each of $S_1$ and $S_2$ may not be a signal source but rather to a signal sink, bidirectional element, transmission line, or other arrangement. As an illustrative example, the switch interconnection terminal could connect to an antenna with $S_1$ and $S_2$ respectively connecting to an outgoing transmitter signal or providing an incoming receiver signal, or the switch interconnection terminal could connect to gas repository or reaction chamber with $S_1$ and $S_2$ connecting to other gas repositories or reaction chambers for mutual interaction.

If the switching elements are able to switch rapidly enough, only at most one switch is on at a time and thus one terminal of the two switches can be directly connected together as shown in FIG. 5a. The resultant arrangement allows the relative size of the reference signal and the periodic waveform to select which of the voltages, currents, or other signals are uniquely directed to the output. For example, in the arrangement depicted in FIG. 5a, this allows the comparator to select whether the output will be (voltage, current, or signal) $S_1$ 501.1 or (voltage, current, or signal) $S_2$ 501.2.

In some situations, connecting the switch terminals directly together may not be practical or possible. For example, if the switching elements are not able to switch rapidly enough, there may be transient instants where both switches are on at a time and in most such situations the terminals of the two switches should not be directly connected together as shown in FIG. 5a. For example, if $S_1$ 501.1 and $S_2$ 501.2 are such that both connected together would cause a short circuit, overload, damage, indeterminate, or other undesirable result, other approaches for forming the output signal may be useful or required. Additionally, some types of $S_1$ and $S_2$ may not permit such connections of switching elements, also requiring other approaches for forming the output.

As to these situations, FIG. 5b shows an example where a summing element, such as an op amp summer 502.3 (with its inputs appropriately terminated to make "switch off" signals well-defined) is used to form the output signal. In other situations, arrangements, and applications the summer may be an appropriately chosen microwave mixer element, optical mixing element, fluidic mixing element, pneumatic mixing element, charge-transfer mixing element, spin-transfer mixing element, magnetic mixing element, acoustic wave mixing element, chemical or biochemical signal transduction mixing element, etc.

Just as the switching elements and mixing elements (for example as depicted in FIGS. 5a and 5b) may be extended and generalized to other types of signals, circuits, and media, additional alternatives include providing for the inputs of the comparators to extend to more general types of signals, circuits, and media. The comparator element need not be a traditional voltage-input or current-input comparator, but could be structured as a comparator responsive to higher-level signal attributes such as relative frequency as disclosed in pending U.S. patent application Ser. No. 11/463,557, Frequency Comparator Utilizing Enveloping-Event Detection Via Symbolic Dynamics Of Fixed Or Modulated Waveforms (published Nov. 16, 2006 as U.S. PTO pre-grant publication 2006/0256908) or more classical frequency comparators well-known to those skilled in the art.

Similarly, a comparator may be structured as a comparator responsive to relative phase, relative rate-of-change, relative integrated accumulation, relative event count, etc. as is known to those skilled in the art. When involving media signals or phenomena other than electrical (such as optical, fluidic, pneumatic, charge, spin, magnetic, acoustic, chemical or biochemical, etc.), these higher-level signal attributes may also be employed. Additionally when involving media signals or phenomena other than electrical (such as optical, fluidic, pneumatic, charge, spin, magnetic, acoustic, chemical or biochemical, etc.) the comparators may be configured to be responsive to media-specific attributes such as relative pressures, relative temperatures, relative flow rates, relative optical or acoustical wavelengths, relative radiated intensities, relative adsorptions, relative field strengths, relative humidities, relative concentrations, relative physical displacements, etc.

Figure 6:
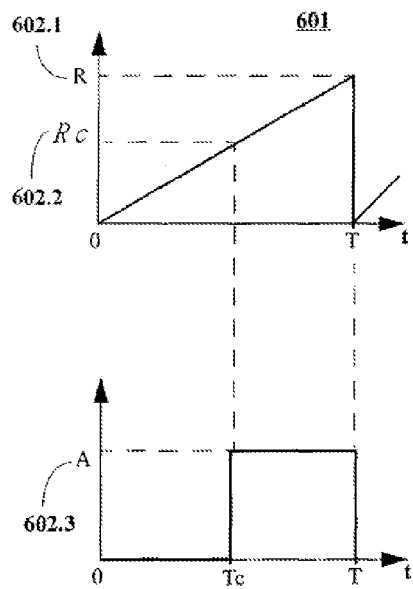
FIG. 6 depicts exemplary generation of a pulse waveform from circuits such as those of FIGS. 4a-4b and FIGS. 5a-5b and equivalent circuits, algorithms, or processes wherein the provided suitably-varying periodic waveform is a periodic ascending ramp waveform.

With comparators and the wide-utility novel extensions to pulse width modulation of other types of circuit and media configurations described, attention is now directed toward creating pulse and pulse width modulated waveforms (in electrical or other media) from various source periodic waveforms. FIG. 6 depicts a technique using a right-anchored periodic pulse of controllable width, $PulseR_c(t)$, which may be generated from a periodic up-going ramp waveform 601 (often referred to as a "sawtooth" or "saw" waveform). Again the waveform may be an electrical quantity, non-electrical media quantity, or quantity associated with higher-level signal attributes. Here the periodic upgoing ramp waveform typically exhibits a linearly increase from a value of zero to a value of R 602.1. The reference signal at a particular instant may be set at a value equal to a proportion $R_c$ 602.2 of this, $0 \leq c \leq 1$. Presenting these waveforms to an appropriate comparator implementation whose output values are $A_{min}=0$ and $A_{max}=A$ 602.3 (any of FIGS. 4a-4b, or FIGS. 5a-5b with $S_1=0$ and $S_2=A$, etc.) results in the depicted pulse, here $PulseR_c(t)$ having value of 0 for the first 100c % of each period, and the value of A for the remaining 100(1−c)% of each period.

Figure 7:
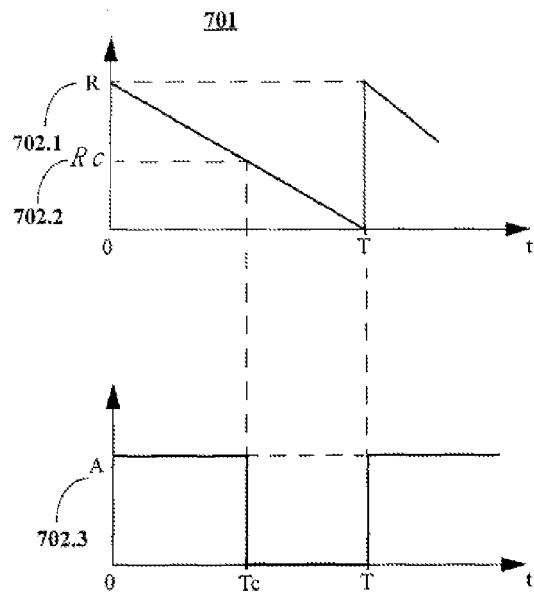
FIG. 7 depicts exemplary generation of a pulse waveform from circuits such as those of FIGS. 4a-4b and FIGS. 5a-5b and equivalent circuits, algorithms, or processes wherein the provided suitably-varying periodic waveform is a periodic descending ramp waveform.

In a similar fashion, FIG. 7 shows a technique for generating a left-anchored periodic pulse of controllable width, $PulseL_c(t)$ from a periodic down-going ramp waveform 701 (also often referred to as a "sawtooth" or "saw" waveform). Again the waveform may be an electrical quantity, non-electrical media quantity, or quantity associated with higher-level signal attributes. Here the periodic up-going ramp waveform is considered to linearly increase from a value of zero to a value of R. The reference signal at a particular instant will be set at a value equal to a proportion $R_c$ of this, $0 \leq c \leq 1$. Presenting these to an appropriate comparator implementation whose output values are $A_{min}=0$ and $A_{max}=A$ (any of FIGS. 4a-4b, or FIGS. 5a-5b with $S_1=0$ and $S_2=A$, etc.) results in the depicted pulse, here $PulseR_c(t)$ having value of A for the first 100c % of each period and the value of 0 for the remaining 100(1−c) % of each period.

Figure 8:
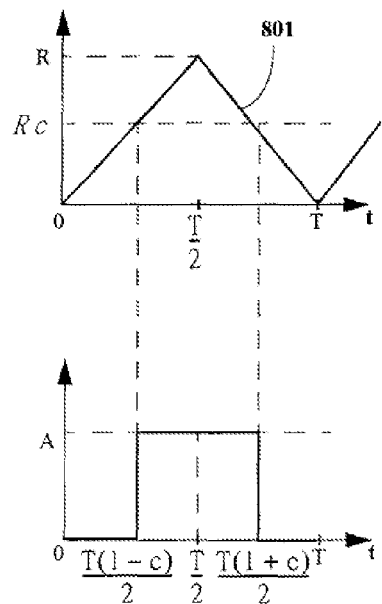
FIG. 8 depicts exemplary generation of a pulse waveform from circuits such as those of FIGS. 4a-4b and FIGS. 5a-5b and equivalent circuits, algorithms, or processes wherein the provided suitably-varying periodic waveform is a periodic triangle waveform.
Figure 9:
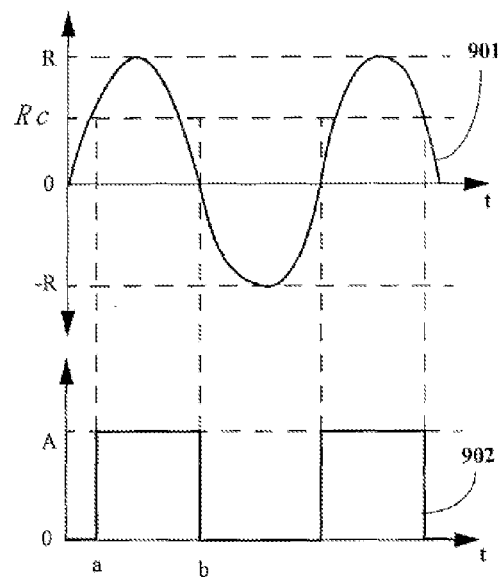
FIG. 9 depicts exemplary generation of a pulse waveform from circuits such as those of FIGS. 4a-4b and FIGS. 5a-5b and equivalent circuits, algorithms, or processes wherein the provided suitably-varying periodic waveform is a periodic sinusoidal waveform.

Accordingly, FIG. 8 shows how a Center-anchored of controllable width, $PulseC_c(t)$ 802, may be generated from a periodic triangle waveform 801 with the same comparator arrangements employed as were in the discussions of FIGS. 6 and 7. In similar fashion, FIG. 9 shows a Center-anchored of controllable width, $PulseG_{a,b}(t)$ 902, as being generated from the positive portions of a periodic sine waveform 901 with similar comparator arrangements employed as were in the discussions of FIGS. 6 and 7.

In FIG. 8, consider:

$$a = \frac{T}{2\pi}\text{Arcsin}[c]$$

$$b = \frac{T}{2} - \frac{T}{2\pi}\text{Arcsin}[c]$$

The pulse width is:

$$\frac{T}{\pi}\text{Arcsin}[c]$$

And the duty cycle is:

$$\frac{100\%}{\pi}\text{Arcsin}[c]$$

Canceling the D.C Term of Periodic Pulse Waveforms produced by Comparators

In cases where the periodic waveform is piece-wise linear with no contiguous portions or segments of zero slope (e.g., ramp and triangle waveforms), the pulse width is proportional to control voltage. This makes it possible to precisely cancel the d.c. term by subtracting a value proportional to the pulse width effect of the control signal. The pulse width effect of the control signal for ramp and triangle waveforms is an affine function of the control signal, i.e., multiplying the control signal by a non-zero scaling constant and adding an offset constant. The values of the non-zero scaling constant and offset constant are dictated by the amplitude extremes of the periodic waveform and the amplitude extremes of the comparator output. If these amplitude extreme values are such that the offset constant is zero, the affine transformation simplifies to a multiplicative proportion. If these amplitude extreme values are also simultaneous such that the scaling constant is of magnitude one, the affine transformation degenerates to multiplying by one and no offset, i.e., simply adding or subtracting the control signal from the comparator output. An example of this case, where the affine transformation is simply a pass-though, will be discussed later in conjunction with FIG. 12.

In cases where the periodic waveform is more general than piece-wise linear with no contiguous portions or segments of zero slope, the pulse width is a more complicated function of the control voltage. In particular, this more complicated function is, within possible scaling and offset, the inverse function of the function corresponding to mapping the time variable t to the periodic waveform amplitude value over the interval of one period $0 \leq t \leq T$. If this time mapping function does not have a well defined inverse, for example if the waveform changes slope, the inverse function is multi-valued and extra provisions must be included, for example slope or inflection point detection subsequently driving state-retaining memory, counters, etc. However, if indeed the inverse function can be identified and implemented, it is similarly possible to exactly cancel the d.c. term by subtracting a value proportional to the pulse width effect of the control signal.

Pulse Width Modulation of Pulse Waveforms with Zero D.C Term in Each Period

Mathematically, "period-average-zero" versions of the unit height pulse waveforms described earlier may be defined in terms of each corresponding waveform by subtracting the d.c. term proportional to the pulse width effect of the control signal. In particular three "period-average-zero" unit-amplitude pulse waveforms may be defined as follows:

$$pazPulseL_\tau(t) = PulseL_\tau(t) - \frac{\tau}{T} \text{ ("Left-anchored")}$$

$$pazPulseR_\tau(t) = PulseR_\tau(t) - \frac{T-\tau}{T} \text{ ("Right-anchored")}$$

$$pazPulseC_\tau(t) = PulseC_\tau(t) - \frac{\tau}{T} \text{ ("Center-anchored")}$$

Alternatively, in terms of duty cycle:

$$pazPulseL_\tau(t) = PulseL_\tau(t) - \frac{d_L}{100\%}$$

$$pazPulseR_\tau(t) = PulseR_\tau(t) - \frac{d_R}{100\%}$$

$$pazPulseC_\tau(t) = PulseC_\tau(t) - \frac{d_C}{100\%}$$

where, $$d_L = d_C = \left(\frac{\tau}{T}\right)100\% \quad \text{(left-anchored pulse and Center-anchored pulse)}$$

$$d_R = \left(\frac{T-\tau}{T}\right)100\% \quad \text{(right-anchored pulse).}$$

These "period-average-zero" unit-amplitude pulse waveforms may be scaled to take on different amplitudes by simply multiplying by a scale factor function, designated below as A:

$$A \; pazPulseL_\tau(t) = A\left(PulseL_\tau(t) - \frac{d_L}{100\%}\right)$$

$$A \; pazPulseR_\tau(t) = A\left(PulseR_\tau(t) - \frac{d_R}{100\%}\right)$$

$$A \; pazPulseC_\tau(t) = A\left(PulseC_\tau(t) - \frac{d_C}{100\%}\right)$$

Figure 10A:
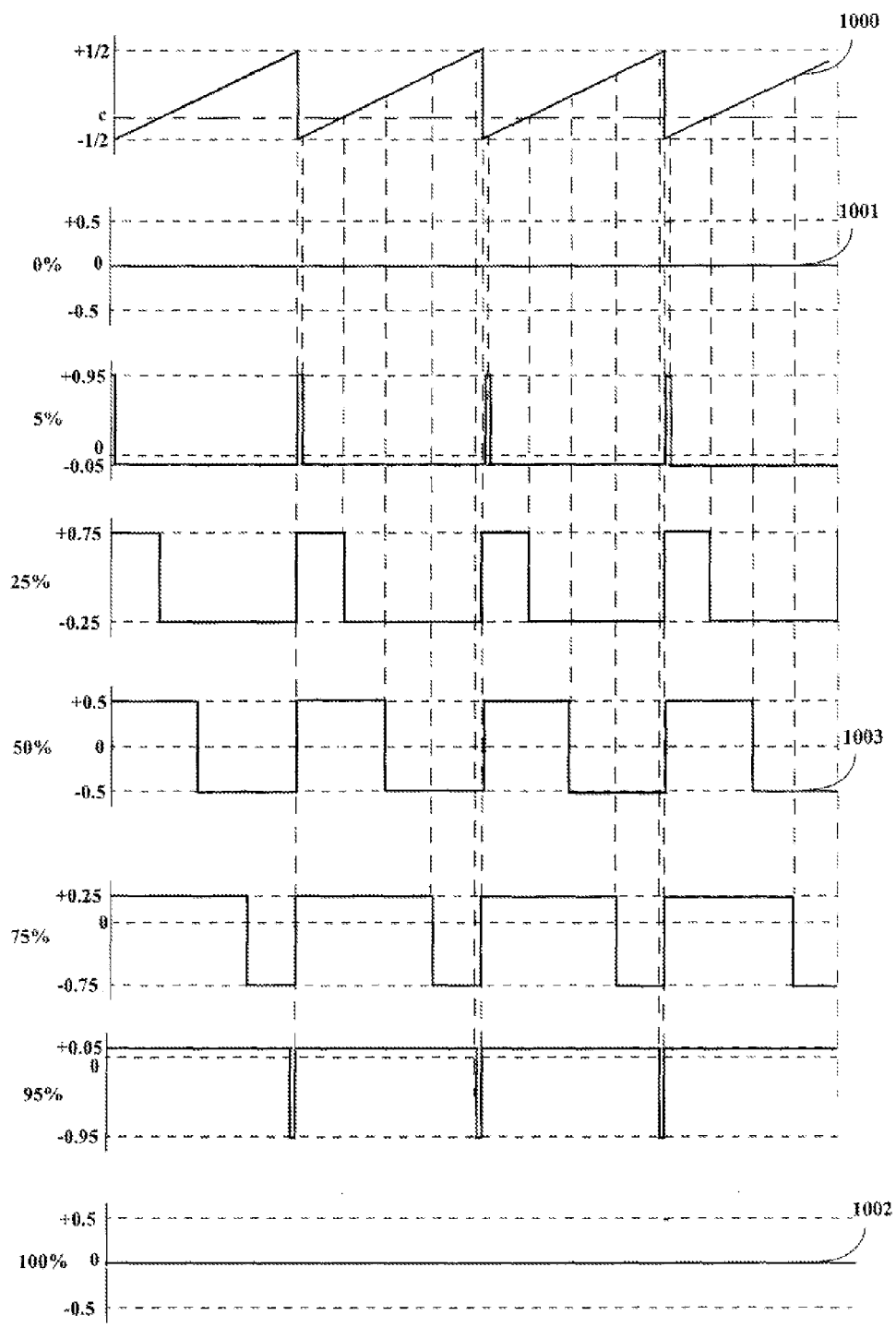
FIG. 10a depicts how an exemplary threshold or comparator function, such as that realized by circuits such as those of FIGS. 4a and 4b or equivalent circuits, algorithms, or processes, produce exemplary pulses of various widths responsive to various provided control signal amplitudes that are subjected to the effects of subtracting the average of each respective resultant waveform from itself.

Using these formulas, FIG. 10*a* shows a few exemplary unit amplitude (i.e., A=1) waveforms for zcPulseR$_\tau$(t) of various pulse widths corresponding to duty cycles of 0%, 5%, 25%, 50%, 75%, 95%, and 100%, as derived by comparing a periodic up-going ramp waveform 1000 ranging between values of −½ and +½ with a reference value c also taking on between values between −½ and +½. The comparisons may be made with comparators (for example, as in the arrangements depicted in FIGS. 4*a*, 4*b*, 5*a*, or 5*b*) or numerically (for example, as will be discussed in conjunction with FIGS. 15*a*-15*f*).

Further as to the waveforms shown in FIG. 10*a*, note the zcPulseR$_\tau$(t) waveform is shown as precisely zero for the 0% duty cycle case 1001 and the 100% duty cycle case 1002. This is significantly different from the case of conventional pulse waveforms where the 0% duty cycle case and 100% duty cycle case are a constant corresponding to one or the other of the two extreme values attained by non-zero duty cycles.

In evolutionary terms, as the duty cycle of zcPulseR$_\tau$(t) increases from zero, the positive pulse peak proportionally widens as the entire pulse waveform proportionally sinks. As an example, consider the following:

At 0% duty cycle, pazPulseR$_\tau$(t) is the constant zero 1001;

At 5% duty cycle, pazPulseR$_\tau$(t) has sank by 5% of its overall amplitude;

At 25% duty cycle, pazPulseR$_\tau$(t) has sank by 25% of its overall amplitude;

At 50% duty cycle, pazPulseR$_\tau$(t) is a square wave 1003 centered at zero, having sank 50% of its overall amplitude;

At 75% duty cycle, pazPulseR$_\tau$(t) has sank by 75% of its overall amplitude;

At 95% duty cycle, pazPulseR$_\tau$(t) has sank by 95% of its overall amplitude;

At 100% duty cycle, pazPulseR$_\tau$(t) is the constant zero 1002, having sank 100% of its overall amplitude.

Figure 10B:
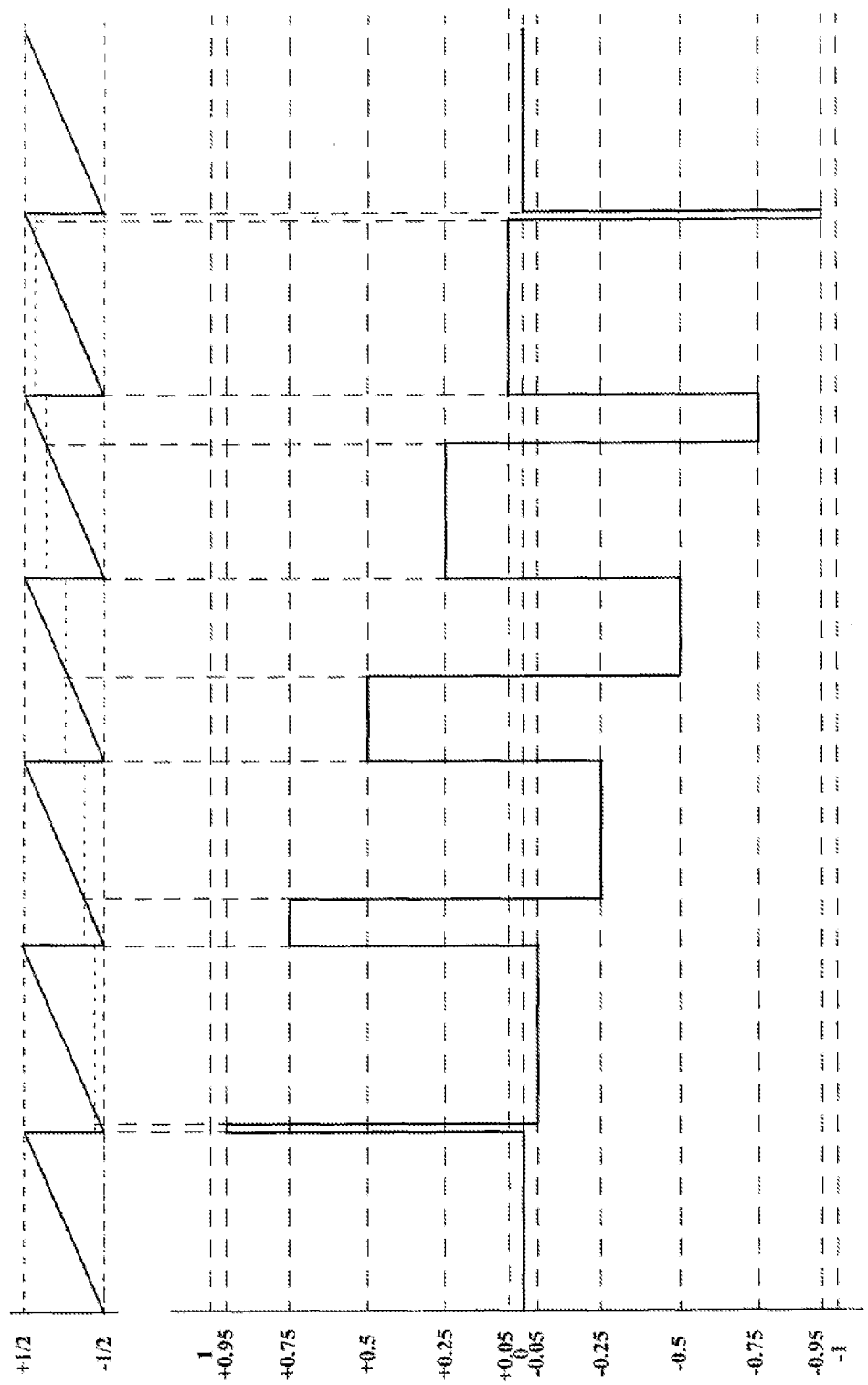
FIG. 10b depicts exemplary period-by-period cases such as those shown in FIG. 10a in succession, thus rendering an exemplary pulse width modulation process wherein each period has zero d.c. term.

FIG. 10b depicts this evolution for pazPulseR$_\tau$(t) in a series of adjacent cycles wherein the duty cycle of each waveform increases from 5% (first cycle), 25% (second cycle), 50% (third cycle) 75% (fourth cycle), 95% (fifth cycle), and 100% (sixth cycle). Again, for pazPulseR$_\tau$(t), the positive pulse peak proportionally widens as the entire pulse waveform proportionally sinks. Similar types of behavior are inherent, adjusted according to their definitions, in pazPulseL$_\tau$(t) and pazPulseC$_\tau$(t). These can be created, for example, by the stepped increase of the reference signal compared to an upgoing ramp waveform, as suggested in this figure.

With this canonical initial characterization, attention is now directed to the synthesis such period-average-zero pulse waveforms from general types of pulse waveform sources.

Additional Development for Various Types of Synthesis of Pulse Waveforms with Zero D.C Term in Each Period As seen in the earlier discussion, in particular with regards to FIGS. 4a, 4b, 5a, and 5b, binary-valued pulse generation circuits will in general create pulses taking on one of two values $A_{max}$ and $A_{min}$. This is also true for numerical implementations of comparators, such as conditional tests and logical conditional branching (IF-THEN-ELSE) statements, as will be described shortly in conjunction with FIGS. 15a-15f, as well as with quantifications of the other types of pulse phenomena described earlier.

Further as to mathematical structures and constructions of the period-average-zero pulse waveforms disclosed herein, various transformations may be used to transform a provided binary-valued pulse waveform taking on values $A_{max}$ and $A_{min}$ into a corresponding period-average-zero pulse waveform of the same amplitude. In a direct transformation approach, the provided binary-valued pulse waveform (with extremal values $A_{max}$ and $A_{min}$) is directly converted to its period-average-zero pulse version by subtracting a value corresponding its average over one period, i.e., the sum of the pulse value $A_{max}$ pro-rated by the duty cycle with pulse value $A_{min}$ pro-rated by the duration of the remainder of the cycle, such as:

$$\text{offset} = \left(\frac{d}{100\%}\right)A_{max} + \left(1 - \frac{d}{100\%}\right)A_{min}$$

Thus the amplitude extremes for the transformed pulse will be shifted according to the following:

$A_{max}$ replaced by $(A_{max}-\text{offset})$ and $A_{min}$ replaced by $(A_{min}-\text{offset})$.

Thus setting $$A_{max} = \frac{A}{2} \text{ and } A_{min} = -\frac{A}{2},$$

the offset calculates as:

$$\text{offset} = \left(\frac{d}{100\%}\right)\frac{A}{2} + \left(1 - \frac{d}{100\%}\right)\left(-\frac{A}{2}\right)$$

$$= \left(\frac{Ad}{100\%}\right) - \frac{A}{2}$$

and the extremal values of a left-anchored period-average-zero pulse as a function of the duty cycle are as follows:

$(A_{max} - \text{offset}) =$ $$\frac{A}{2} - \left(\left(\frac{Ad}{100\%}\right) - \frac{A}{2}\right) = \frac{A}{2} - \left(\frac{Ad}{100\%}\right) + \frac{A}{2} = A\left(1 - \frac{d}{100\%}\right)$$

and $(A_{min} - \text{offset}) =$ $$-\frac{A}{2} - \left(\left(\frac{Ad}{100\%}\right) - \frac{A}{2}\right) = -\frac{A}{2} - \left(\frac{Ad}{100\%}\right) + \frac{A}{2} = -A\left(\frac{d}{100\%}\right)$$

This is shown depicted in FIG. 10f and will be discussed in more detail in conjunction with that figure.

Returning to the amplitude extremes for the transformed pulse of ($A_{max}$-offset) and ($A_{min}$-offset), it is readily confirmed that the average over the period of the transformed is clearly zero by simply multiplying each extremal amplitude value by the proportion of the time per period spend at that amplitude value. These are equal in magnitude and opposite in sign, such as presented by the following:

$$\left(\frac{d}{100\%}\right)(A_{max} - \text{offset}) + \left(1 - \frac{d}{100\%}\right)(A_{min} - \text{offset}) =$$

$$\left(\frac{d}{100\%}\right)A_{max} + \left(1 - \frac{d}{100\%}\right)A_{min} - \text{offset}\left(1 + \frac{d-d}{100\%}\right) =$$

$$\left(\frac{d}{100\%}\right)A_{max} + \left(1 - \frac{d}{100\%}\right)A_{min} - \text{offset} = 0$$

Thus the described waveforms have zero average value over each period. Additionally, the amplitude of the original pulse ($A_{max}-A_{min}$) is typically unaffected by this transformation as subtracting the offset term is simply an offset translation; this can also be formally verified as follows:

$(A_{max}\text{-offset})-(A_{min}\text{-offset})=(A_{max}-A_{min})$

Further as to mathematical structures and constructions of the period-average-zero pulse waveforms as used in the invention, next the temporal duration (rather than duty cycle) representations are considered. For the left-anchored and Center-anchored pulse waveforms depicted in FIG. 1a and FIG. 1c, 1″ is related to d by:

$$d_L = d_C = \left(\frac{\tau}{T}\right)100\% \text{ (left-anchored pulse and Center-anchored pulse)}$$

as given earlier. Thus, in terms of $\tau$ this term to be subtracted from extremal values Amax and A min, translating the waveform location on the amplitude axis, is:

$$\text{offset}_L = \left(\frac{\tau}{T}\right)A_{max} + \left(\frac{T-\tau}{T}\right)A_{min}$$

$$\text{offset}_C = \left(\frac{\tau}{T}\right)A_{max} + \left(\frac{T-\tau}{T}\right)A_{min}$$

For the right-anchored pulse waveform depicted in FIG. 1b, $\tau$ is related to d by:

$$d_R = \left(\frac{T-\tau}{T}\right)100\% \text{ (right-anchored pulse)}$$

as given earlier. Thus, in terms of $\tau$ this term to be subtracted from extremal values Amax and A min, translating the waveform location on the amplitude axis, is:

$$\text{offset}_R = \left(\frac{T-\tau}{T}\right)A_{max} + \left(\frac{\tau}{T}\right)A_{min}$$

Offset Term Generally Does Not Produce Symmetry

Note subtracting this offset term is in general a different operation from that of simply centering the provided binary-valued pulse waveform to oscillate symmetrically about the value of zero. In general, an additional transformation would then be required to convert the pulse symmetrically oscillating about zero to a period-average-zero pulse waveform. That transformation is also obtained by subtracting the average over the pulse period, but this time that of the pulse symmetrically oscillating about zero. The composite transformations are depicted in the transformation diagram depicted in FIG. 10c.

Figure 10C:
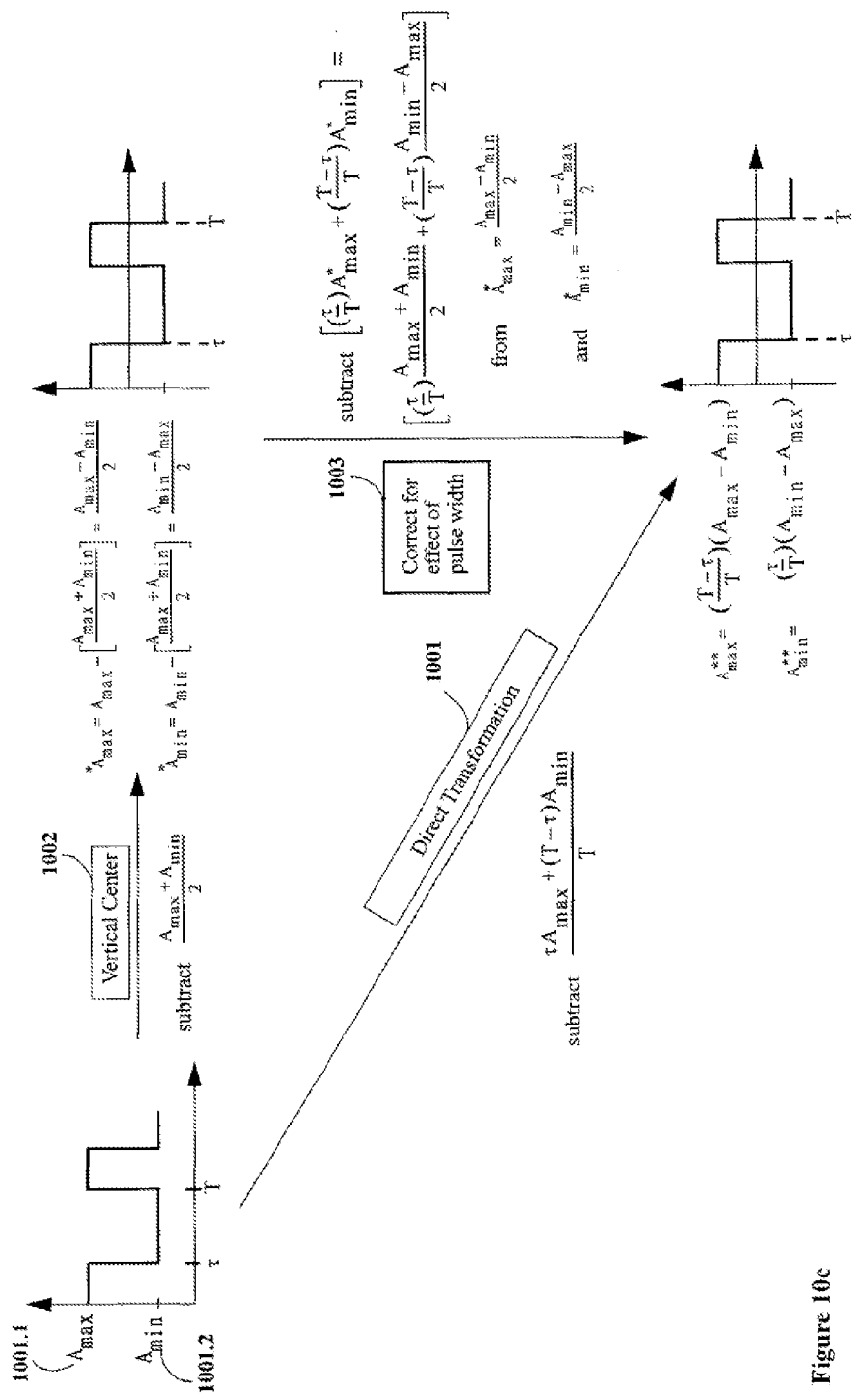
FIG. 10c depicts various exemplary transformations between a pulse waveform of arbitrary minimum and maximum, a zero-centered version resulting from subtracting the average of the minimum and maximum vales, and a zero d.c. term version resulting from subtracting the average of the waveform over the entire period.

Specifically, FIG. 10c shows transformations that can be used to transform a provided binary-valued pulse waveform taking on values $A_{max}$ 1001.1 and $A_{min}$ 1001.2 into a corresponding period-average-zero pulse waveform of the same amplitude. In a direct transformation approach 1001, the provided binary-valued pulse waveform (with extremal values $A_{max}$ 1001.1 and $A_{min}$ 1001.2) is directly converted to its period-average-zero pulse version by subtracting a value corresponding its average over one period, i.e., the sum of the pulse value $A_{max}$ pro-rated by the duty cycle with pulse value $A_{min}$ prorated by the duration of the remainder of the cycle, such as represented by the following:

$$\left(\frac{d}{100\%}\right)A_{max} + \left(\frac{1-d}{100\%}\right)A_{min}$$

For the pulse waveform depicted in FIG. 10c, $\tau$ is related to d by:

$$d = \tau/T \, 100\%$$

as given earlier. In terms of $\tau$, this term to be subtracted from extremal values $A_{max}$ 1001.1 and $A_{min}$ 1001.2, thus translating the center of the waveform on the amplitude axis, can be represented as:

$$\left(\frac{\tau}{T}\right)A_{max} + \left(\frac{T-\tau}{T}\right)A_{min}$$

Note this is different from a "vertical centering" operation 1002 on the provided binary-valued pulse waveform to oscillate symmetrically about zero. In contrast, in order to vertically center the provided binary-valued pulse waveform symmetrically about zero, one merely subtracts the average of the two extremal values Amax 1001.1 and Amin 1001.2, the average given by:

$$\frac{(A_{max} + A_{min})}{2}$$

As shown in FIG. 10c, this subtraction operation 1002 results in a new waveform with new extremal values $A^*_{max}$ and $A^*_{min}$ given by:

$$A^*_{max} = A_{max} - \left[\frac{(A_{max} + A_{min})}{2}\right] = \frac{(A_{max} - A_{min})}{2}$$

$$A^*_{min} = A_{min} - \left[\frac{(A_{max} + A_{min})}{2}\right] = \frac{(A_{min} - A_{max})}{2}$$

An additional transformation 1003 would then be required to convert the pulse symmetrically oscillating about zero to a period-average-zero pulse waveform. That transformation 1003 is also obtained by subtracting the average over the pulse period, but this time that of the pulse symmetrically oscillating about zero. The composite action of the symmetrically centering transformation 1002 and the additional transformation 1003 is depicted in FIG. 10c, giving the same result as the direct transformation 1001 as can be seen from the following calculation:

$$\begin{aligned}
A^{**}_{max} &= A^*_{max} - \left[\left(\frac{\tau}{T}\right)(A^*_{max}) + \left(\frac{T-\tau}{T}\right)(A^*_{min})\right] \\
&= \frac{A_{max} - A_{min}}{2} - \left[\frac{\tau}{T}\left(\frac{A_{max} - A_{min}}{2}\right) + \left(\frac{T-\tau}{T}\right)\left(\frac{A_{min} - A_{max}}{2}\right)\right] \\
&= \frac{T(A_{max} - A_{min})}{2T} - \frac{\tau(A_{max} - A_{min})}{2T} - \left(\frac{(T-\tau)(A_{min} - A_{max})}{2T}\right) \\
&= \frac{(A_{max} - A_{min})[T - \tau + (T-\tau)]}{2T} \\
&= \frac{(A_{max} - A_{min})(2T - 2\tau)}{2T} \\
&= \frac{(T-\tau)}{T}(A_{max} - A_{min})
\end{aligned}$$

and $$\begin{aligned}
A^{**}_{min} &= A^*_{min} - \left[\left(\frac{\tau}{T}\right)(A^*_{max}) + \left(\frac{T-\tau}{T}\right)(A^*_{min})\right] \\
&= \frac{A_{min} - A_{max}}{2} - \left[\frac{\tau}{T}\left(\frac{A_{max} - A_{min}}{2}\right) + \left(\frac{T-\tau}{T}\right)\left(\frac{A_{min} - A_{max}}{2}\right)\right] \\
&= \frac{T(A_{min} - A_{max})}{2T} - \frac{\tau(A_{max} - A_{min})}{2T} - \left(\frac{(T-\tau)(A_{min} - A_{max})}{2T}\right) \\
&= \frac{(A_{min} - A_{max})[T - \tau(-1) - (T-\tau)]}{2T} \\
&= \frac{(A_{min} - A_{max})[T + \tau - T + \tau]}{2T} \\
&= \frac{\tau}{T}(A_{min} - A_{max})
\end{aligned}$$

Mathematical Structures and Constructions Directed Towards Comparison Operations Further as to mathematical structures and constructions of the period-average-zero pulse waveforms as used in various embodiments, formulations of these relationships are now made relevant to comparison operations, as may be used in electronic comparators, numerical methods, and other implementations discussed before and to follow. The unit-amplitude left-anchored pulse $zcPulseL_\tau(t)$ depicted in FIG. 10a will have a duty cycle given by:

$$d = \left(c + \frac{1}{2}\right)100\%$$

as c ranges from $-\frac{1}{2}$ to $+\frac{1}{2}$. FIG. 10a has an offset given by:

$$\text{offset} = \left(\frac{1}{2} + c\right)A_{max} + \left(1 - \left(c + \frac{1}{2}\right)\right)A_{min}\left(\frac{1}{2} + c\right)A_{max} + \left(\frac{1}{2} - c\right)A_{min}$$

so for each value of c between $-\frac{1}{2}$ and $+\frac{1}{2}$, the extremal values of the $zcPulseL_\tau(t)$ depicted in FIG. 10a are given by:

$$\begin{aligned}
(A_{max} - \text{offset}) &= A_{max} - \left(\frac{1}{2} + c\right)A_{max} - \left(\frac{1}{2} - c\right)A_{min} \\
&= \left(\frac{1}{2} - c\right)A_{max} - \left(\frac{1}{2} - c\right)A_{min} \\
&= \left(\frac{1}{2} - c\right)(A_{max} - A_{min})
\end{aligned}$$

and $$(A_{min} - \text{offset}) = A_{min} - \left(\frac{1}{2} + c\right)A_{max} + \left(\frac{1}{2} - c\right)A_{min}$$
$$= \left(-\frac{1}{2} - c\right)A_{max} - \left(-\frac{1}{2} - c\right)A_{min}$$
$$= \left(-\frac{1}{2} - c\right)(A_{max} - A_{min})$$

For the unit-amplitude case, that is cases where $(A_{max} - A_{min}) = 1$, FIG. 10d depicts the resulting waveform. Solving for c in:

$$d = \left(c + \frac{1}{2}\right)100\%$$

gives $$c = \left(-\frac{1}{2}\frac{d}{100\%}\right).$$

As d ranges from 0% to 100%, c will typically meaningfully range from $-\frac{1}{2}$ to $+\frac{1}{2}$. This agrees with each of the cases depicted in FIG. 10a.

The resulting affairs can then be readily scaled to an arbitrary amplitude value. For example, FIG. 10e shows the affairs depicted in FIG. 10d scaled by a positive constant A, resulting in the waveform left-anchored pulse:

$$A_{zcPulseL_T(t)}$$

whose extremal values are $(A/2-c)$ and $(-A/2-c)$ as c ranges from $-A/2$ to $+A/2$ according to:

$$c = A\left(\frac{d}{100\%} - \frac{1}{2}\right)$$

It is understood that many other representations and derivations are possible as will be apparent to one skilled in the art.

From this result, one may then obtain the most general case and show it agrees with an earlier calculation. The extremal values are calculated to be:

$$\left(\frac{A}{2} - c\right) = \frac{A}{2} - A\left(\frac{d}{100\%} - \frac{1}{2}\right) = A\left(1 - \frac{d}{100\%}\right)$$

and $$\left(-\frac{A}{2} - c\right) = -\frac{A}{2} - A\left(\frac{d}{100\%} - \frac{1}{2}\right) = A\left(\frac{d}{100\%}\right)$$

as depicted in FIG. 10f and as derived earlier from core properties of the period-average-zero waveform. Note the amplitude of this waveform is of course the constant A:

$$\left(\frac{A}{2} - c\right) - \left(-\frac{A}{2} - c\right) = A$$

Exemplary Electronic Circuit Realizations

With these mathematical descriptions, characterizations applicable to implementations and other background established, electronic signal generation and numerical of period-average-zero pulse waveforms will now be considered as representative examples. However, as is clear to one skilled in the art, the exemplary methods, systems, and principles to follow also readily apply to use with other types of signals, circuits, and media and associated comparators for these corresponding types of signals, circuits, and media.

Figure 11G:
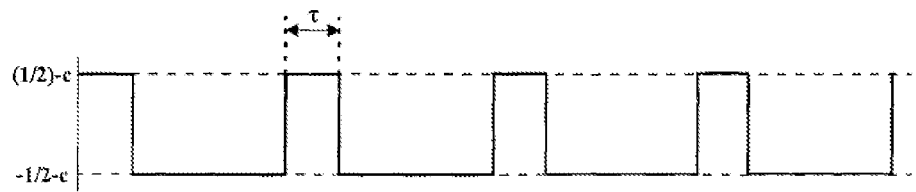
FIG. 11g depicts an exemplary implementation of a zero d.c. term pulse width generation arrangement as provided for by an embodiment of the invention.
Figure 11G:
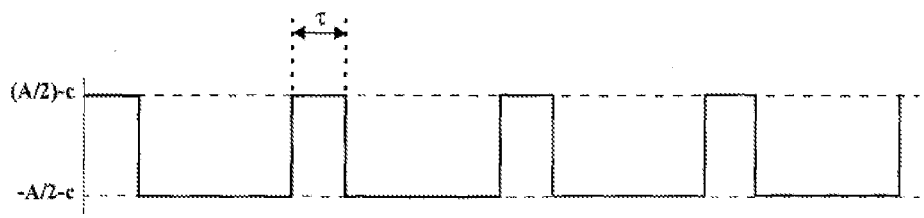
Figure 11G:
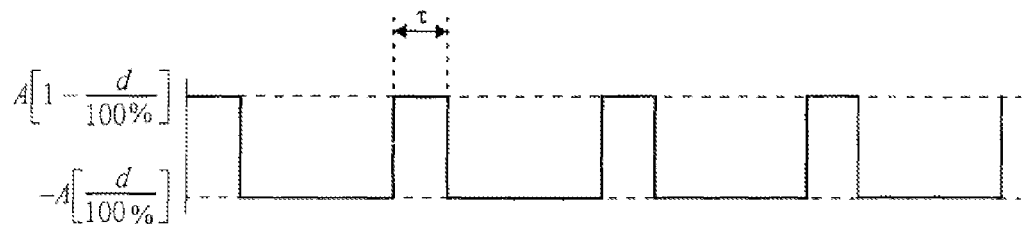
Figure 11G:
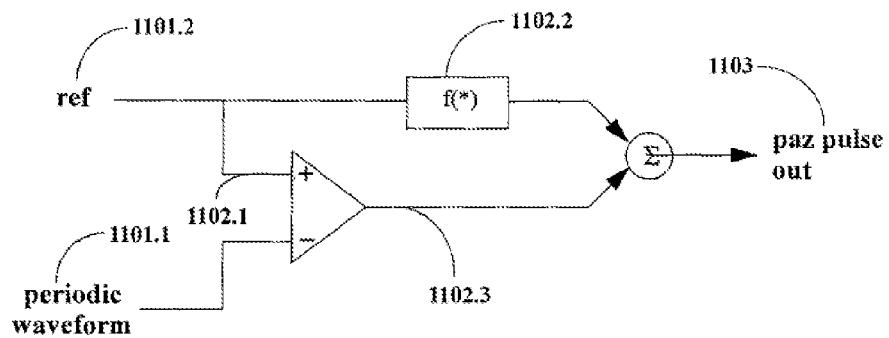

FIG. 11g shows a general implementation as may be implemented by embodiments of the invention. A periodic waveform 1101.1 signal is shown applied to one input of comparator. A reference is 1101.2 provided to both the other terminal of the comparator 1102.1 and a function block 1102.2 performing a transformation on the reference. The transformed reference is then summed with the comparator output 1102.3. The result is a pulse waveform 1103 whose d.c. term for each period is zero.

If the periodic waveform is a ramp wave and a left-anchored or right-anchored pulse is desired, the function block 1102.2 performs an appropriate affine transformation. If the periodic waveform 1101.1 is a triangle wave and a Center-anchored pulse is desired, the function block 1102.2 also performs an appropriate affine transformation. If the periodic waveform is more general than piece-wise linear with no contiguous portions or segments of zero slope, the function block performs an inverse function of the function corresponding to mapping the time variable t to the periodic waveform amplitude value over the interval of one period. If this inverse is multi-valued, the function block performed resolves the branch of the inverse function, for example by employing state-retaining memory.

This method, or more precisely related family of methods, produces pulse and pulse width modulated waveforms with zero d.c. term for each period. The resulting waveform offers several advantages over existing d.c. term removal methods, systems, and practices. These include no corruption of pulse edges, or leakage of higher frequency control signal components. Further, high rate modulations of pulse width do not produce "modulated-carrier feed-through" that would traditionally result from a d.c. term.

Figure 11A:
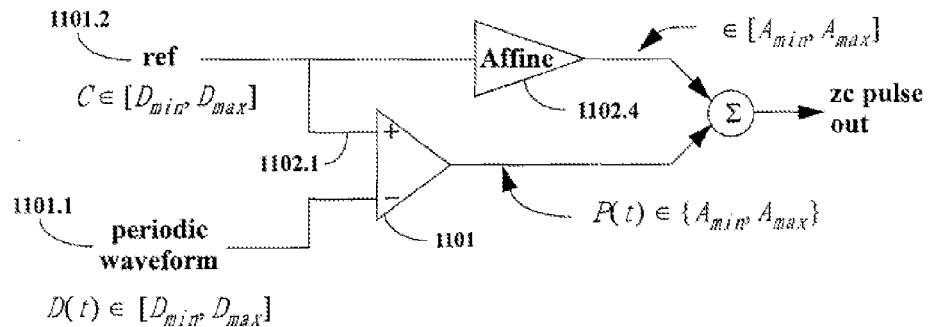
FIGS. 11a through 11c depict various exemplary implementations of a zero d.c. term pulse width generation arrangements comprising affine transformations as provided for by another embodiment of the invention.
Figure 11B:
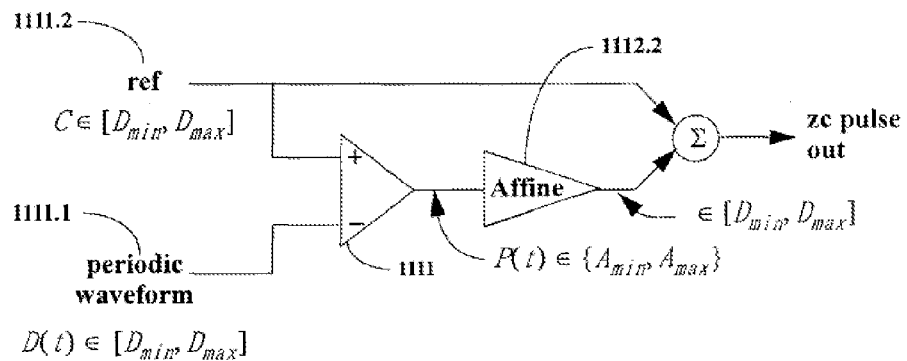
Figure 11C:
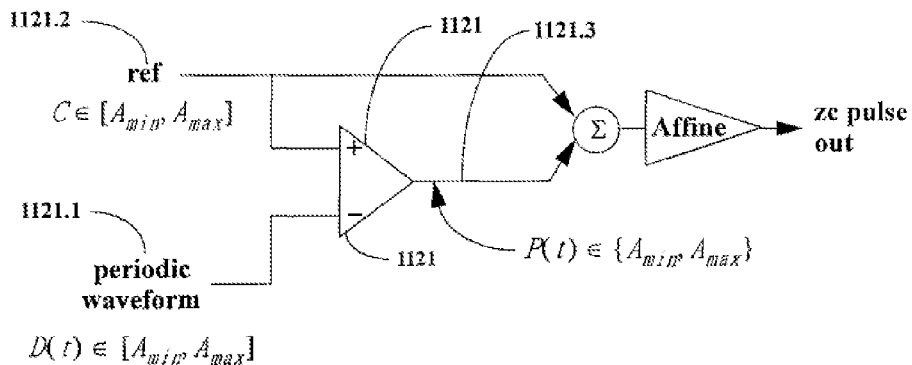

Some exemplary specific examples of realizations and adaptations of FIG. 11g are now considered. FIG. 11a, FIG. 11b, and FIG. 11c show exemplary block diagrams characterizing embodiments of the invention employing an affine (scaling and offset) transformation at various points in the signal chain for cases where the periodic waveform is piecewise linear with no segments of zero slope (ramp or triangle waveforms).

FIG. 11a shows the most direct literal following of the arrangement of FIG. 11g for this case, and in accordance with earlier descriptions the function block 1102.2 in FIG. 11g realizes an affine transformation so as to make the extreme values of the transformed reference signal 1101.2 $D_{min}$ and $D_{max}$ match the extreme values of the comparator Amin and Amax. Such an affine transformation 1102.2 employs scaling and offset constants to linearly map the interval $[D_{min}, D_{max}]$ to the interval $[A_{min}, A_{max}]$. The result is a zero d.c., or what could also be termed as "per-period zero averaged," or "period-average-zero," pulse waveform with values of $A_{min}$ and $A_{max}$.

In many situations, the period-average-zero pulse waveform created by the arrangement of FIG. 11a may have values that are different that what is ultimately required. For example, it is often required that desired resultant pulse have amplitude values consistent with those of the periodic waveform 1101.1, which due to the symmetry of the comparator inputs must also be those of the reference signal 1101.2, namely $D_{min}$ and $D_{max}$. This desired result could of course be obtained by applying a second affine transformation 1102.4 (linearly mapping the interval [$A_{min}$, $A_{max}$] to the interval [$D_{min}$, $D_{max}$]) to the output of FIG. 11*a*. However, this second affine transformation inverse of the affine transformation used in FIG. 11*a*. By linearity, this second affine transformation 1102.2 can be brought back over through the summing operation and be separately applied to each of the summed signals. The first and second affine transformations cancel one another, resulting in a direct pass-though to the summer, while the second affine transformation is retained at the output of the comparator. The result is the arrangement of FIG. 11*b*, equivalent to FIG. 11*a* with the second affine transformation applied to its output.

In a third exemplary specific example, consider the case where the comparator 1121 and/or the periodic waveform 1121.1 (and reference signal 1121.2) have been adjusted so the periodic waveform, reference signal 1121.2, and comparator output 1121.3 all match. Such an arrangement may be found advantageous in many circuit implementations, typified in aspects of the case that will be discussed in conjunction with FIG. 12 where simplicity and utility are clearly seen. Here, as described early and also as in the case of FIG. 11*b*, the function block 1102.2 in FIG. 11*g* is realized as a pass through direct to its summing with the direct comparator output. The resulting period-average-zero pulse may then be needed in an application where a different operating interval is desired. To obtain this, an affine transformation can be applied. In many situations, such as in electronic circuitry, the summing operation and this subsequent affine transformation may be readily implemented in a common circuit, that is, the feedback resistor in a summing op amp configuration may be used to set a scaling factor, and an offset voltage or current is readily added at the summing node via a single additional component (i.e., summing resistor), these appreciated by one skilled in the art and described further in later discussion made in conjunction with FIG. 12.

It is noted that the cases described in conjunction with FIGS. 11*g* and 11*a*-11*c* are only exemplary. The invention provides many variations and adaptations of these features that are readily possible as is clear to one skilled in the art.

As an example of a more complex situation, consider the pulse and pulse width modulation generation from the positive portion of a periodic sine waveform 901 as depicted earlier in FIG. 9. The pulse and pulse width modulation waveforms 902 produced from a sine wave can also be period-average-zero by the arrangement of FIG. 11*g*, but here the function block requires an appropriately centered and scaled arcsine function. In particular, centering and scaling of the reference may be required to align properly with the domain of the arcsine function, and centering and scaling may be required to map the natural range of the arcsine function realization with that of the comparator and/or desired output requirements.

FIG. 11*a* is a fairly direct literal implementation of the arrangement of FIG. 11*g*. Since one affine transformation followed by an additional affine transformation is (in general) itself an affine transformation, the centering and scaling required to map the natural range of the arcsine function realization with that of the comparator can be readily combined with the affine transformation depicted in FIG. 11*a* to produce an equivalent combined affine transformation. The result is depicted in FIG. 11*d*.

Figure 11D:
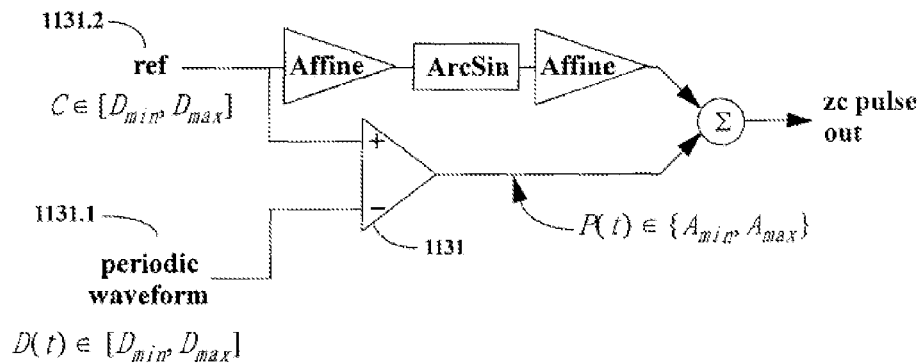
FIGS. 11d through 11f depict various exemplary implementations of the exemplary arrangements of FIGS. 11a through 11c adapted for use with periodic sine waves as provided for by some embodiments of the invention.
Figure 11E:
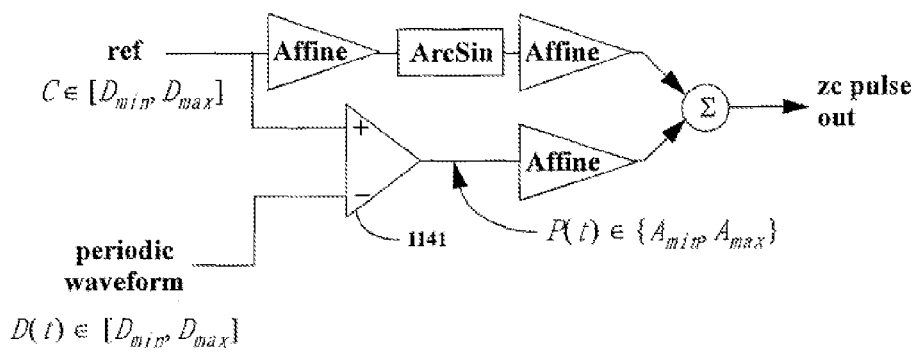

FIG. 11*e* illustrates the afore described arrangement of FIG. 11*b*, here with the two additional affine transformations required for the centering and scaling of the reference to 1131.2 to align properly with the domain of the arcsine function and the centering and scaling required to map the natural range of the arcsine function realization to that of the desired output requirements. The affine transformation 1112.2 present in FIG. 11*b* is typically unaffected by this introduction.

If by chance the two affine transformations immediately preceding the summer can be made identical, a single instance of that affine transformation can be realized on the output of the summer to replace the two identical ones distributed over the summed signals. In a similar way, FIG. 1*lf* depicts a realization of FIG. 11*c* with the reference pass through replaced by the two additional affine transformations required for the centering and scaling the reference to align properly with the domain of the arcsine function and the centering and scaling required to map the natural range of the arcsine function realization to that of the desired output requirements.

Figure 11F:
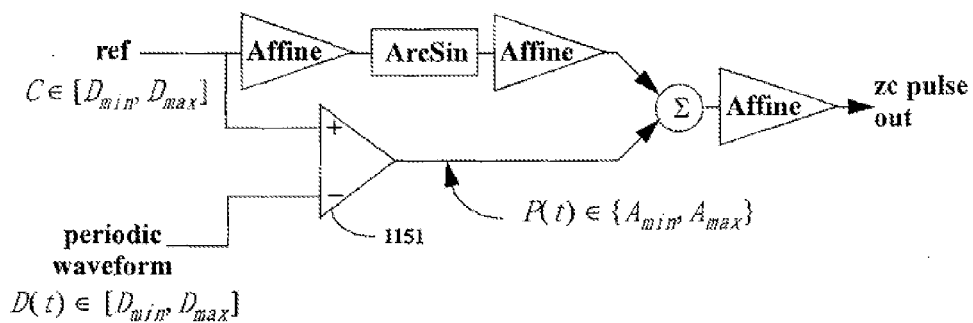

It is noted that the cases described in conjunction with FIGS. 11*d*-11*f* are only exemplary. The scope of such examples provides for many variations and adaptations of these, as well as adaptations to work with other types of periodic waveforms or with other aspects of sinusoidal waveforms, all of which are straightforward and readily possible as is clear to one skilled in the art.

Figure 12:
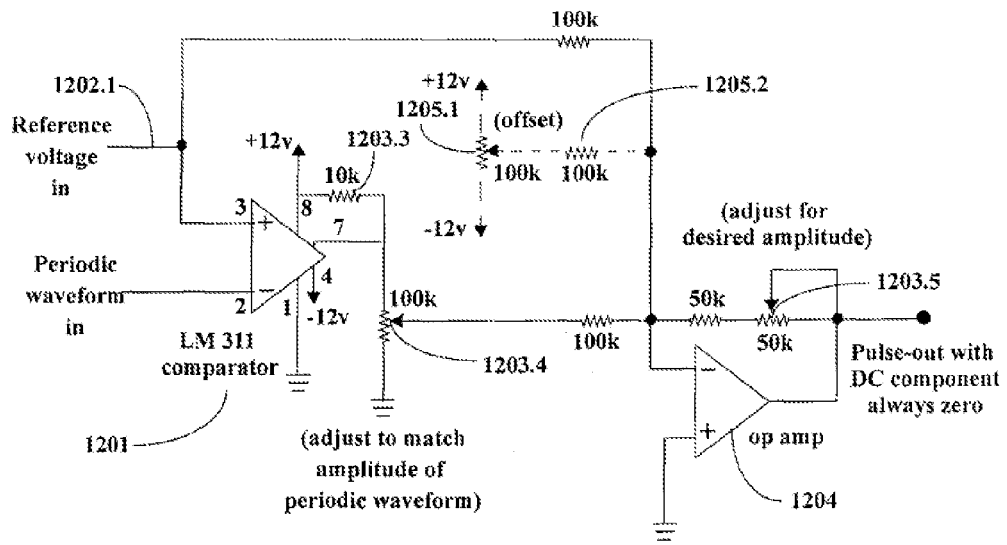
FIG. 12 depicts an exemplary circuit realization as provided for by embodiments of the invention.

FIG. 12 shows an exemplary implementation using the direct signal output of an LM311 comparator 1201. This circuit combines aspects of FIGS. 11*b* and 11*c*, and showcases one technique for implementing the approach. Here the reference signal 1202.1 is passed through as in FIGS. 11*b* and 11*c*. The LM311 comparator pulse output low value is 0 volts by pin 1 and high value is set to 12 volts by the pull-up resistor 1203.3 at pin 7. An adjustable potentiometer 1203.4 is used to adjust the multiplicative scaling factor setting the size of the comparator pulse output. Another adjustable potentiometer, 1203.5 located in the feedback loop of the summing op amp 1204, is used to adjust the multiplicative scaling factor after the summer. An optional offset voltage can be added by including the third potentiometer 1205.1 and associated summing resistor 1205.2 depicted in broken lines. These three potentiometers 1203.4, 1203.5, 1205.1 allow for realizations of either, both, or none of the affine transformations depicted in FIGS. 11*b* and 11*c*. The circuit of FIG. 12 is only exemplary and many variations and adaptations are readily possible as is clear to one skilled in the art.

Figure 13B:
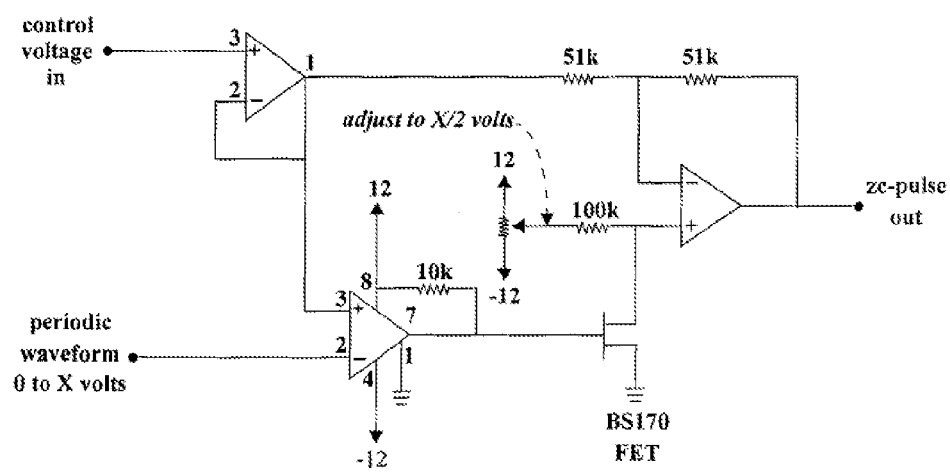
FIGS. 13a and 13b depicts other exemplary circuit realization as provided for by further embodiments of the invention.
Figure 13A:
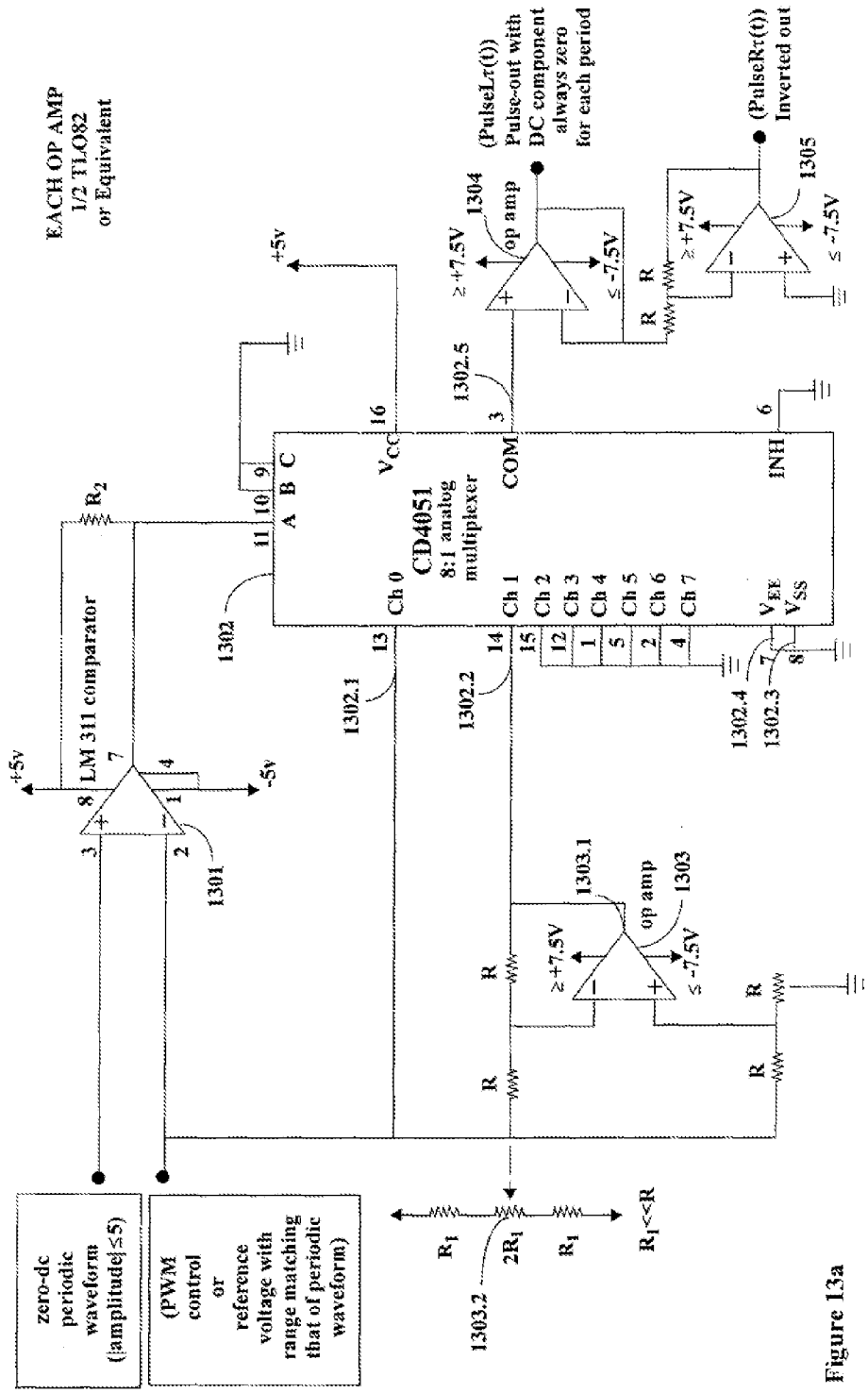

FIG. 13*a* shows an exemplary implementation of the approach of FIG. 5*a* to realize the waveform production depicted in FIG. 10*f* employing the affine transformation structure abstracted from that of FIG. 11*b*. Clearly there are a wide range of many other implementations, for example involving the approach of FIG. 5*b* and/or the waveform productions of FIGS. 10*d*-10*e* and/or the affine transformation structure depicted in FIG. 11*a* or 11*c*, or a literal realization of the arrangement of FIG. 11*b*.

Additionally, rather than a straightforward exacting realization using an op amp as a comparator and analog switches, as is common in the conventional art, an alternative realization is provided to illustrate various additional methods, systems, and approaches provided for and encompassed by the present disclosure.

In one aspect of this example, an LM311 1301 comparator is used to control analog switching; as described earlier its output voltage swings can be adjusted (through the voltage at pin 1 and voltage applied to pull-up resistor R2 to pin 7) to match the needs of a wide range of switching elements. Thus, note that the operational range of the LM311 inputs and/or output can be extended by connecting powering pin 8 to a higher voltage and/or powering pin 4 to a lower voltage as is clear to one skilled in the art.

Next, although a traditional CMOS CD4016 or CD4066 quad analog switch 1302 chip, or more precision analog switch chip products, could be used in a closely tracked realization of FIG. 5a, a CMOS CD40S1 8:1 analog multiplexer controlled to select between channels 0 and 1 (pin 13 1302.1 and pin 14 1302.2) is employed instead to implement a mutually-exclusive analog switch operation. Such an approach helps assure a "break-before-make" switch operation so as to prevent the signals presented to channels 0 and 1 from shorting together during switching transients.

At a system-design level, although an op amp could be used as a comparator, the LM311 is used to readily create well-defined logic-level signals (and fast transitions) for the CD40S1 analog multiplexer chip. As is known to one skilled in the art, or can be found in the widely available CD40S1 chip specification sheets, the CD40S1 8:1 analog multiplexer also provides separate $V_{SS}$ and $V_{EE}$ pins (pin 7 1302.4 and pin 8 1302.3) to facilitate additional level shifting that may be desirable in extending the voltage range of the exemplary circuit with minimized consideration to switch voltage and logic voltage range compatibilities. Many options are available to serve as the $S_1$ and $S_2$ signals provided to the CD40S1 chip.

For this example, a periodic voltage waveform with zero d.c. term (zero average value) and with an amplitude somewhat less than ±5 volts is applied to the first input and a reference voltage with corresponding range may be applied to the second input as shown. Referring to FIG. 10d −1 Of and associated calculations earlier described in association, it can be seen that the reference signal level c is simply subtracted from both extremal valves of the switch. In the representation of FIG. 10f, one extremal value of the depicted zero-center pulse waveform is:

$$-A\left(\frac{d}{100\%}\right)$$

and the other extremal value of the waveform is this same value plus the constant A, that is:

$$A - A\left(\frac{d}{100\%}\right)$$

If the periodic input waveform is a up-going ramp, down-going ramp, or triangle wave, the resultant duty cycle will be an affine transformation of the control or reference voltage. Since the periodic voltage waveform and the control or reference voltage are both applied directly to the comparator, in this example the control or reference voltage will be directly applied to one channel of the analog multiplexer with the intent to scale and or invert as needed after the analog multiplexer's switching operation. The other input channel to the analog multiplexer, then, must be equivalent to the same signal summed with a constant. This may be obtained by subtracting a voltage determined by a resistor network (or other voltage source) that can be set or adjusted to the proper voltage level. Thus, the reference voltage is provided directly to channel 0 and an inverted and offset version 1303.1 of the reference signal, realized by an op amp summer 1303, provides the signal to channel 1.

The range of the reference voltage is usually matched with the setting of the offset potentiometer 1303.2. This offset adjustment sets the amplitude of the resulting pulse, created by the voltage difference between channel 0 1302.1 (pin 13) and channel 1 1302.2 (pin 14), to match the range of the reference signal. This approach sets the voltage levels at the analog multiplex "COM" 1302.5 (pin 3) to match those produced at the summer for FIG. 11b, effectively replacing the comparator and affine transformation used in FIG. 11b. From here, a unitary gain op amp 1304 reinforces the voltage signal for output loading, and an inverting op amp 1305 multiplies the signal by −1 to get the sign arrangements expected from the methods associated with FIGS. 10d-10f (i.e., the reference or control voltage term having a minus sign).

As will be shown shortly, period-average-zero PulseL and period-average-zero PulseR waveforms turn out to be related by multiplication by −1, so these two outputs provide both types of pulses at once. Rather than add a second stage of inversion, it is noted that the inverted signal is already present as a buffered signal as the output of the unitary gain op amp 1304, so that can be used to provide the complementary output.

Again, the circuit of FIG. 13a is only exemplary and by intent meant to demonstrate several of a wide range of concepts since many variations and adaptations are readily possible as is clear to one skilled in the art. For example, again note that the representation of FIG. 10f, one extremal value of the depicted zero-center pulse waveform is equivalent to: and the other extremal value of the waveform is this same value plus the constant A, thus equivalent to:

$$-A\left(\frac{d}{100\%}\right)$$

Thus a period-average-zero pulse waveform could be realized by simply summing the control voltage with a comparator-switched signal (that is either zero or a value corresponding to the constant −A) with a simple inverting summer as depicted in FIG. 13b. Although an analog switch readily could be used, for diversity of illustration purposes a switching FET is employed here. Depending on whether an enhancement-mode or depletion-mode switching FET is used, the signals provided to comparator "+" and "−" inputs may be appropriately exchanged.

Figure 14:
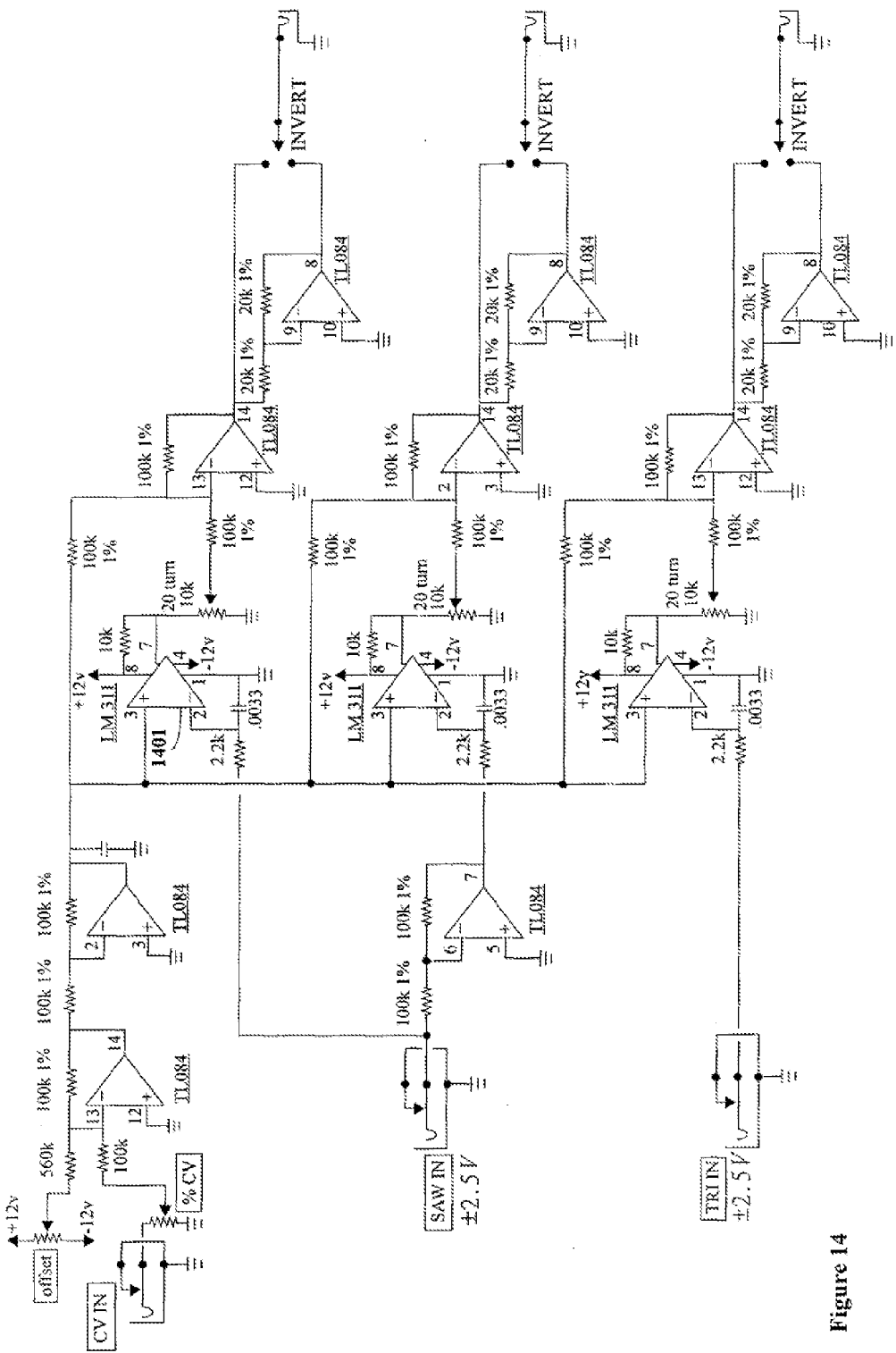
FIG. 14 depicts an exemplary implementation of a three-channel output system simultaneously providing a zero d.c. component version of the three pulse width modulation signals of FIGS. 1a through 1c.

FIG. 14 shows an exemplary implementation of a three-channel output system, once again using the direct signal output of an LM311 comparator 1401 as was done in the implementation of FIG. 12. This three-channel arrangement simultaneously provides the three PWM signals of FIG. 1a-FIG. 1c, each with a zero d.c. component. As described in Ludwig & Hutchins "A New Look at Pulse Width Modulation, Part 3," Electronotes, Vol. 12 No. 118, October 1980, pp. 3-24, or may be seen from direct trigonometric manipulation, the modulated waveforms of FIGS. 1a and b may be viewed as frequency shifted versions of the waveform of FIG. 1c. This frequency shift results from representing the waveforms of FIG. 1a and FIG. 1b as Doppler (time, or phase) shifted versions of the waveform of FIG. 1c. This time shifting required amounts to a backwards time shift of (T+τ)/2 to transform the waveform of FIG. 1c into that of FIG. 1 and a forward time shift of (T−τ)/2 to transform the waveform of FIG. 1c into that of FIG. 1b.

The instantaneous rate of time shift determines the frequency shift. These representations are intrinsic to a natural frame of reference. For example, the ear indeed hears the PWM waveforms of FIG. 1a and FIG. 1b as pitch-shifted versions of the PWM process of FIG. 1c. As a music synthesizer module, then, the waveforms from the top and middle outputs of the circuit of FIG. 14 will be such that if the control voltage or offset controls are adjusted dynamically, one output will sound as if it is shifted up in pitch while the other will sound as if it is shifted down in pitch. When rendered as a stereo signal, this dynamical "detuning" creates a richer sound than the pitch-neutral bottom output.

Ramp and triangle waveforms can be provided by VCO chips such as the CEM 3040, SSM2030 as well as numerous "function generator" chips. Alternatively, ramp waveforms and triangle waveforms may be converted from one to the other as may be needed using, for example, many well-known wave-shaping techniques. The frequency-shifted and non-frequency-shifted pulse-width modulated waveforms may be used in other applications, such as motor control. The circuit of FIG. 14 is only exemplary and many variations and adaptations are readily possible as is clear to one skilled in the art.

Per-Period Sample-and-Hold for More Rapidly Meandering Reference Signals

The pulse width may be set by the values where the state of the comparator changes. For fixed pulse widths or slowing varying modulations, this introduces no to little concerns when the reference is summed with the comparator output. However, for more rapidly changing reference signals, simply summing the reference signal, with or without affine transformations, can introduce undesired effects as suggested by FIG. 15a. This can be addressed by introducing a sample-and-hold operation 1515 that samples at the beginning of each period, as depicted in FIG. 15b.

Implementation as an Integrated Circuit or System-on-a-Chip (SoC) IP Core

The electrical systems and methods described may be readily implemented as a discrete circuit, as part of a larger system, as a new stand-alone integrated circuit chip offering, and/or as an IP core for System-on-a-Chip implementations. The systems and methods pertaining to optical, fluidic, pneumatic, charge, spin, magnetic, acoustic, chemical or biochemical, and other signals or phenomena may be implemented as dedicated discrete apparatus, as part of a larger system, and/or as a type of chip or subsystem or "IP core" for Lab-on-a-Chip and other multi-phenomenon/multi-process implementations in micro scale or nanoscale technologies.

Various embodiments described herein may be implemented in a computer-readable medium using, for example, computer software, hardware, or some combination thereof. For a hardware implementation, the embodiments described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, other electronic units designed to perform the functions described herein, or a selective combination thereof.

For a software implementation, various embodiments may be implemented with separate software modules, such as procedures and functions, each of which perform one or more of the functions and operations described herein. The software codes can be implemented with a software application written in any suitable programming language and may be stored in memory and executed by a controller or processor, for example.

Exemplary Numerical and Algorithmic Realizations

Figure 16A:
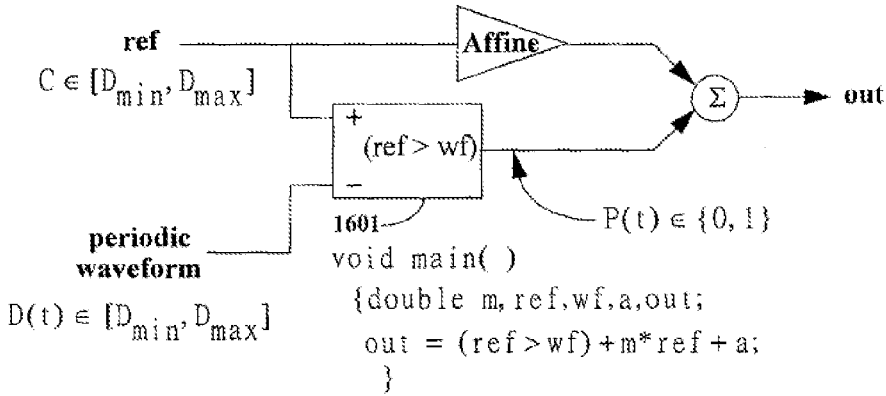
FIGS. 16a through 16f depict various exemplary algorithmic embodiments and realizations as provided for by some embodiments of the invention.
Figure 16B:
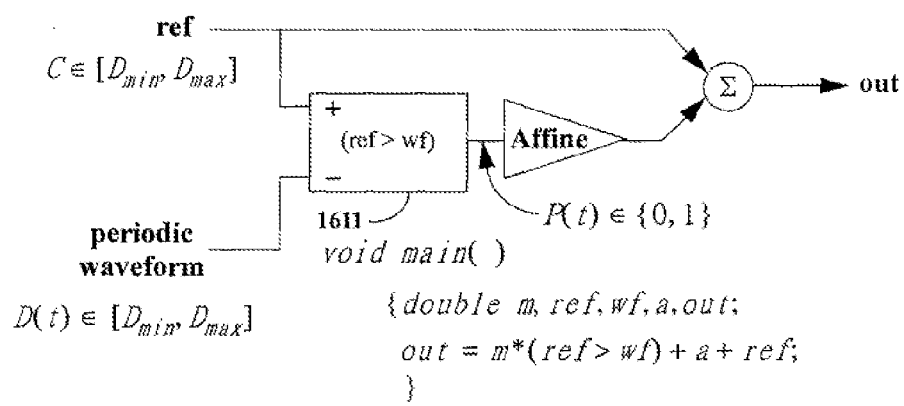
Figure 16C:
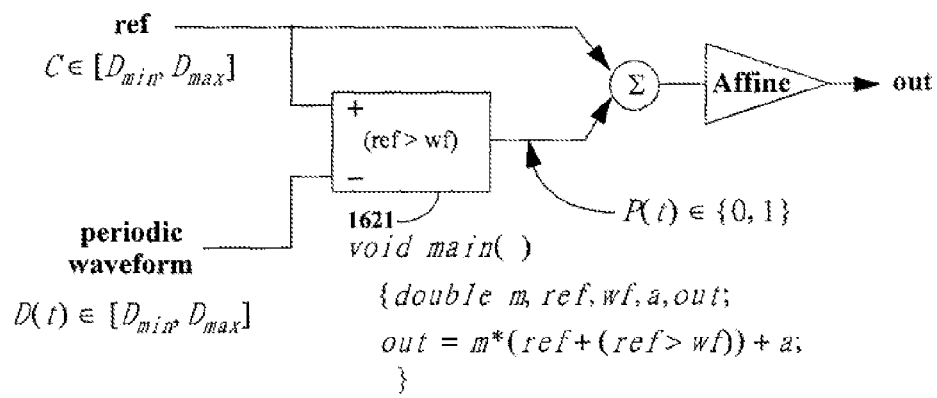

FIGS. 16a-16c show an exemplary implementation as an algorithm using the C programming language. FIG. 16a utilizes the 0ll truth value of a conditional test as a comparator whose $A_{min}=0$ and $A_{max}=1$. The logical binary data type produced can be directly mixed in subsequent calculations, or formally converted to a fixed, float, or integer data type taking on these values. FIG. 16a depicts then one algorithmic implementation of the approach of FIG. 11a. Both a block diagram 1601 and exemplary C programming language code is provided. Similarly, FIGS. 16b and 16c depicts one algorithmic implementation of the approach of FIGS. 11 band 11c.

Figure 16D:
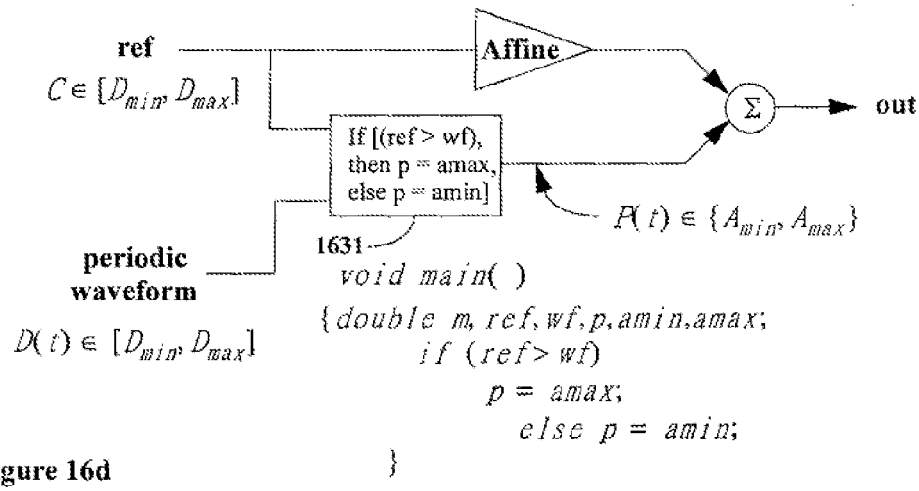
Figure 16E:
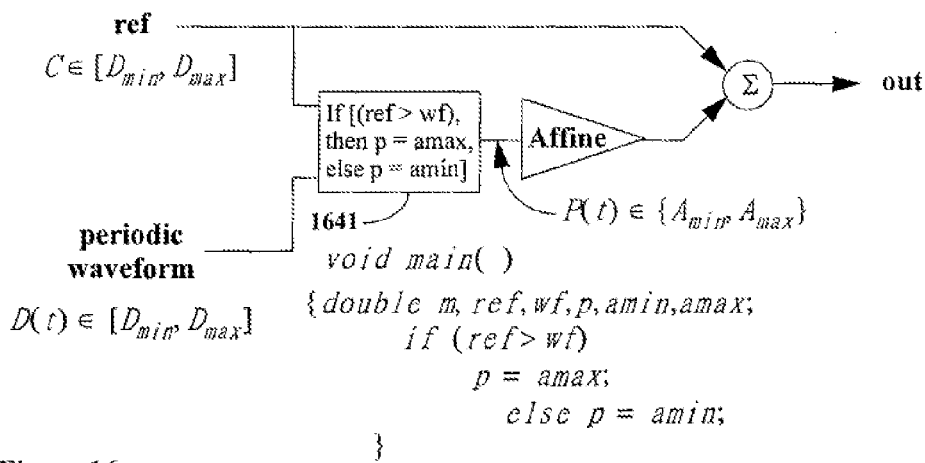
Figure 16F:
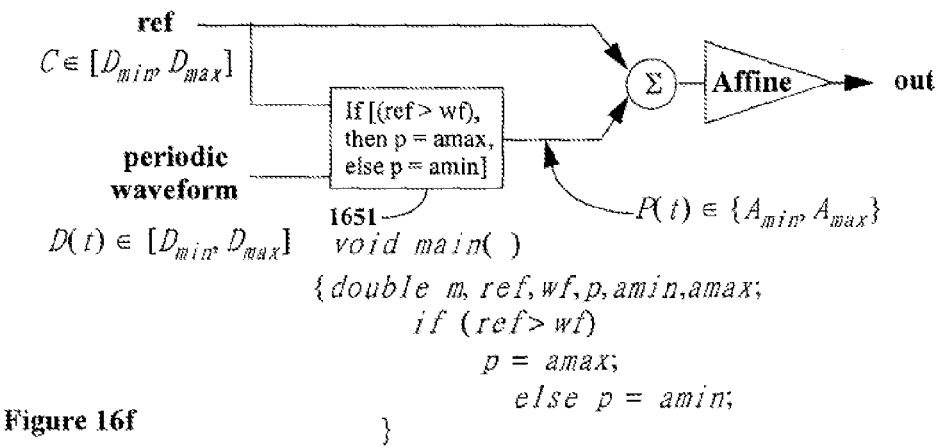

FIG. 16d-16f show implementations utilizing an if/then conditional test 1631, 1641, 1651 to assign values to an output variable. This is the approach of FIG. 5 and is analogous to the method used in the electronic circuit of FIG. 13 where the comparator selects which switch is active and the switches subsequently assign a voltage value to the output. Each of FIGS. 16d-16f respectively correspond to FIGS. 11a-11c and 16a-16c wherein the hardware comparators 1101, 1111, 1121 and hardware comparators 1601, 1611, 1621 in those six figures are implemented as IF-THEN-ELSE statements 1631, 1641, 1651.

Development of Further Properties Facilitating Additional Implementations and Applications In addition to traditional applications described above, the zero-d.c. pulse waveforms, both mathematically and as produced by the systems and methods provided herein, are surprisingly unusual and turn out to have particular properties which may be used for additional science and engineering purposes. Several of these features will now be described.

Canonical Form within the Heart of Ramp-Wave Phase Shifting

Some of the special properties of the zero-d.c. pulse waveforms suitable for science and engineering are in relation with period-average-zero ramp waveforms. Period-average-zero pulse width modulation can be shown to have a special property where it can be summed together with a synchronized ramp wave to produce a phase-shifted ramp wave, for example, where the phase shift varies with the duty cycle.

This property results from a reorganization of the ramp wave phase-shifting technique conceived by the inventor of the present disclosure. One example of this was subsequently prototyped by B. Hutchins, and published with attribution to both in 1978. See Ludwig & Hutchins, "Multi-Phase Scanning with Sawtooth Waveforms," *Electronotes Application Note*, No. 73, Ithaca, N.Y., Feb. 4, 1978. In this reference, ramp waves were assumed to be 0-5 units (volts in that reference), i.e. centered at 2.5 rather than period-average-zero, and a number of additional terms were included in the summing for compensation. The graphical deviation is somewhat complex due to the bookkeeping of several d.c. terms present in the original application and implementation.

Utilizing aspects of the present disclosure, it is now understood that with a period-average-zero ramp, the situation is made far simpler and in fact canonical as no additional terms are required. FIG. 17 illustrates this geometrically in accordance with one exemplary embodiment. Additionally, this result can formally be proved by Fourier series computations, an example of which is set out below.

From the opening discussion, the Fourier series for the period-average-zero pulses $pazPulseL_\tau(t)$, $pazPulseR_\tau(t)$, and $pazPulseC_\tau(t)$ are:

$$pazPulseL_\tau(t) = \frac{1}{\pi}\sum_{n=1}^{\infty}\frac{1}{n}\left[\sin\left(\frac{2n\pi\tau}{T}\right)\cos\left(\frac{2n\pi t}{T}\right) + \left(1 - \cos\left(\frac{2n\pi\tau}{T}\right)\right)\sin\left(\frac{2n\pi t}{T}\right)\right]$$

$$pazPulseR_\tau(t) = -\frac{1}{\pi}\sum_{n=1}^{\infty}\frac{1}{n}\left[\sin\left(\frac{2n\pi\tau}{T}\right)\cos\left(\frac{2n\pi t}{T}\right) + \left(1 - \cos\left(\frac{2n\pi\tau}{T}\right)\right)\sin\left(\frac{2n\pi t}{T}\right)\right]$$

$$pazPulseC_\tau(t) = -\frac{2}{\pi}\sum_{n=1}^{\infty}\frac{1}{n}\left[(-1)^n\sin\left(\frac{n\pi\tau}{T}\right)\cos\left(\frac{2n\pi t}{T}\right)\right]$$

These are readily obtained from the earlier corresponding Fourier series by dropping the constant terms, according to their very definition. Note that $$pazPulseL_\tau(t)=-pazPulseR_\tau(t).$$

Recall that this was used in the exemplary design illustration of FIG. 13.

Next, one may compute the Fourier series coefficients for a rising-ramp from 0 to 1 (unit amplitude) UpRamp(t) with period T, such that:

$$a_0 = \frac{2}{T}\int_0^T \frac{x}{T}dx = \frac{2}{T}\frac{x^2}{2T}\Big|_{x=0}^{x=T} = \frac{2}{T}\cdot\frac{T^2}{2T} = 1$$

$$a_n = \frac{2}{T}\int_0^T \frac{x}{T}\cos\left(\frac{2\pi nx}{T}\right)dx = \frac{2}{T^2}\left[\frac{1}{(2\pi n)^2}\cos\left(\frac{2\pi nx}{T}\right) + \frac{x}{2\pi n}\sin\left(\frac{2\pi nx}{T}\right)\right]\Big|_{x=0}^{x=T} =$$

$$\frac{2}{T^2}\left[\frac{1}{(2\pi n)^2} - \frac{1}{(2\pi n)^2}\right] = 0$$

$$b_n = \frac{2}{T}\int_0^T \frac{x}{T}\sin\left(\frac{2\pi nx}{T}\right)dx =$$

$$\frac{2}{T^2}\left[\frac{T^2}{(2\pi n)^2}\sin\left(\frac{2\pi nx}{T}\right) - \frac{xT}{2\pi n}\cos\left(\frac{2\pi nx}{T}\right)\right]\Big|_{x=0}^{x=T} =$$

$$\frac{2}{T^2}\left[-\frac{T^2}{2\pi n}\right] = -2\left[\frac{1}{2\pi n}\right] = -\frac{1}{\pi n}$$

Thus all cosine terms {an} are zero, and the Fourier series of a rising-ramp of period T with unit amplitude UpRamp(x) is:

$$UpRamp(t) = \frac{a_0}{2} + \sum_{n=1}^\infty b_n \sin\left(\frac{2n\pi t}{T}\right) = \frac{1}{2} - \frac{1}{\pi}\sum_{n=1}^\infty \frac{1}{n}\sin\left(\frac{2n\pi t}{T}\right)$$

Thus the Fourier series for a rising-ramp of period T with unit amplitude and zero d.c. component ("period-average-zero") zcUpRamp(x) is:

$$zcUpRamp(t) = -\frac{1}{\pi}\sum_{n=1}^\infty \frac{1}{n}\sin\left(\frac{2n\pi t}{T}\right)$$

The downward ramp is simply the negative of this:

$$zcDownRamp(t) = -zcUpRamp(t) = \frac{1}{\pi}\sum_{n=1}^\infty \frac{1}{n}\sin\left(\frac{2n\pi t}{T}\right)$$

To phase shift either of these, i.e., to shift the x argument by $\phi$, one may calculate directly and expand with trigonometric angle addition formulas. For example:

$$zcUpRamp(x - \phi) = -\frac{1}{\pi}\sum_{n=1}^\infty \frac{1}{n}\sin\left(\frac{2n\pi(x-\phi)}{T}\right)$$

and through application of:

$$\sin(A-B)=\sin(A)\cos(B)-\cos(A)\sin(B)$$

this expands as:

$$zcUpRamp(x - \phi) = -\frac{1}{\pi}\sum_{n=1}^\infty \frac{1}{n}\left[\sin\left(\frac{2n\pi x}{T}\right)\cos\left(\frac{2n\pi\phi}{T}\right) - \cos\left(\frac{2n\pi x}{T}\right)\sin\left(\frac{2n\pi\phi}{T}\right)\right]$$

Now calculate the sum of zcUpRamp(t)+pazPulse$L_\tau$(t):

$$zcUpRamp(t) + pazPulseL_\tau(t) = -\frac{1}{\pi}\sum_{n=1}^\infty \frac{1}{n}\sin\left(\frac{2n\pi\tau}{T}\right) +$$

$$\frac{1}{\pi}\sum_{n=1}^\infty \frac{1}{n}\left[\sin\left(\frac{2n\pi\tau}{T}\right)\cos\left(\frac{2n\pi\tau}{T}\right) + \left(1 - \cos\left(\frac{2n\pi\tau}{T}\right)\right)\sin\left(\frac{2n\pi t}{T}\right)\right] =$$

$$\frac{1}{\pi}\sum_{n=1}^\infty \frac{1}{n}\left[\sin\left(\frac{2n\pi\tau}{T}\right)\cos\left(\frac{2n\pi t}{T}\right) + \left(-1 + 1 - \cos\left(\frac{2n\pi\tau}{T}\right)\right)\sin\left(\frac{2n\pi t}{T}\right)\right] =$$

$$\frac{1}{\pi}\sum_{n=1}^\infty \frac{1}{n}\left[\sin\left(\frac{2n\pi\tau}{T}\right)\cos\left(\frac{2n\pi t}{T}\right) - \cos\left(\frac{2n\pi\tau}{T}\right)\sin\left(\frac{2n\pi t}{T}\right)\right]$$

Note this agrees with the Fourier series for the phase-shifted zcUpRamp(t−τ)

$$zcUpRamp(t - \tau) = -\frac{1}{\pi}\sum_{n=1}^\infty \frac{1}{n}\left[\sin\left(\frac{2n\pi t}{T}\right)\cos\left(\frac{2n\pi\tau}{T}\right) - \cos\left(\frac{2n\pi t}{T}\right)\sin\left(\frac{2n\pi\tau}{T}\right)\right]$$

Thus:

$$zcUpRamp(t)+pazPulseL_\tau(t)=zcUpRamp(t-\tau)$$

Additional Cases Providing Wide Range of Additional Ramp-Wave Phase Shifting Implementations
Using $$pazPulseL_\tau(t)=-pazPulseR_\tau(t)$$

and $$zcDownRamp(t)=-zcUpRamp(t)$$

one may also obtain:

$$zcUpRamp(t)-pazPulseR_\tau(t)=zcUpRamp(t-\tau)$$

$$zcDownRamp(t)+pazPulseR_\tau(t)=zcDownRamp(t-\tau)$$

$$zcDownRamp(t)-pazPulseR_\tau(t)=zcDownRamp(t-\tau)$$

These may be employed by various circuits and algorithms for the synthesis of phase-shifted ramp waves.

Further, the ramp-wave phase shifting is usually completely independent of any additive constant and scaling factor. As for additive constants:

$$[zcUpRamp(t)+h]+pazPulseL_\tau(t)=[zcUpRamp(t-\tau)+h]$$

$$[zcUpRamp(t)+h]-pazPulseR_\tau(t)=[zcUpRamp(t-\tau)+h]$$

$$[zcDownRamp(t)+h]+pazPulseR_\tau(t)=[zcDownRamp(t-\tau)+h]$$

$$[zcDownRamp(t)+h]-pazPulseL_\tau(t)=[zcDownRamp(t-\tau)+h]$$

Thus one may add or subtract the appropriate period-average-zero pulse with amplitude matching that of a ramp wave and obtain a phase-shifted version of the ramp wave, regardless of what the d.c. term of the ramp wave.

As for scaling factors:

$$A_{[zcUpRamp(t)+pazPulseL_\tau(t)]} = A_{zcUpRamp(t-\tau)}$$

$$A_{[zcUpRamp(t)-pazPulseR_\tau(t)]} = A_{zcUpRamp(t-\tau)}$$

$$A_{[zcDownRamp(t)+pazPulseR_\tau(t)]} = A_{zcDownRamp(t-\tau)}$$

$$A_{[zcDownRamp(t)-pazPulseL_\tau(t)]} = A_{zcDownRamp(t-\tau)}$$

and any additive constant and scaling factor together:

$$A_{[zcUpRamp(t)+h]} + A_{pazPulseL_\tau(t)} = A_{[zcUpRamp(t-\tau)+h]}$$

$$A_{[zcUpRamp(t)+h]} - A_{pazPulseR_\tau(t)} = A_{[zcUpRamp(t-\tau)+h]}$$

$$A_{[zcDownRamp(t)+h]} + A_{pazPulseR_\tau(t)} = A_{[zcDownRamp(t-\tau)+h]}$$

$$A_{[zcDownRamp(t)+h]} - A_{pazPulseL_\tau(t)} = A_{[zcDownRamp(t-\tau)+h]}$$

Zero D.C. Pulse Waveforms as the Difference of Two Ramp Waveforms of Different Phases One may further manipulate these to obtain relations such as:

$$zcUpRamp(t) - zcUpRamp(t-\tau) = pacPulseR_\tau(t)$$

$$zcDownRamp(t) - zcDownRamp(t-\tau) = pazPulseL_\tau(t)$$

which may be employed by various circuits and algorithms for the synthesis of a period-average-zero pulse waveform. This property can be used to develop a beat-frequency model for the difference of two ramp waveforms in terms of period-aver age-zero pulse width modulation as will be presented below.

Employing Ramp-Wave Phase Shifting to Measurement Applications

Since the value of a period-average-zero ramp wave is a linear (or affine) function of its intra-period phase angle, an arrangement involving various embodiments of the invention described above may be used in instrumentation for the measurement of a phase angle of an exogenous system or phenomena. Such measurement methods and systems are also possible based upon the teachings herein.

Since the width of a period-average-zero pulse wave is a linear function of its intra-period phase angle, an arrangement involving the above-described aspects may be used in instrumentation for the measurement of a phase angle of an exogenous system or phenomena. Such measurement methods and systems are also provided and encompass various embodiments of the present invention.

Center-Anchored Pulse Representation as the Sum of Left-Anchored and Right-Anchored Pulses Geometrically it can be seen that the sum:

$$pazPulseL_{\left(\frac{T-\tau}{2}\right)}(t) + pazPulseR_{\left(\frac{T+\tau}{2}\right)}(t)$$

is the same as $$-pazPulseC_\tau(t)$$

as is suggested by visual review of FIGS. 1a-1c. This can be formalized via Fourier series calculation:

$$pazPulseL_{\left(\frac{T-\tau}{2}\right)}(t) + pazPulseR_{\left(\frac{T+\tau}{2}\right)}(t) =$$

$$\frac{1}{\pi}\sum_{n=1}^{\infty}\frac{1}{n}\left[\sin\left(\frac{2n\pi\left(\frac{T-\tau}{2}\right)}{T}\right)\cos\left(\frac{2n\pi t}{T}\right)+\right.$$

$$\left(1-\cos\left(\frac{2n\pi\left(\frac{T-\tau}{2}\right)}{T}\right)\right)\sin\left(\frac{2n\pi t}{T}\right)\right]-$$

$$\frac{1}{\pi}\sum_{n=1}^{\infty}\frac{1}{n}\left[\sin\left(\frac{2n\pi\left(\frac{T+\tau}{2}\right)}{T}\right)\cos\left(\frac{2n\pi t}{T}\right)+\left(1-\cos\left(\frac{2n\pi\left(\frac{T+\tau}{2}\right)}{T}\right)\right)\right.$$

$$\left.\sin\left(\frac{2n\pi t}{T}\right)\right]=\frac{1}{\pi}\sum_{n=1}^{\infty}\frac{1}{n}\left[\left[-\sin\left(\frac{2n\pi\left(\frac{T+\tau}{2}\right)}{T}\right)+\right.\right.$$

$$\sin\left(\frac{2n\pi\left(\frac{T-\tau}{2}\right)}{T}\right)\right]\cos\left(\frac{2n\pi t}{T}\right)+\left[-\cos\left(\frac{2n\pi\left(\frac{T-\tau}{2}\right)}{T}\right)+\right.$$

$$\left.\cos\left(\frac{2n\pi\left(\frac{T+\tau}{2}\right)}{T}\right)\right]\sin\left(\frac{2n\pi t}{T}\right)\right]=$$

$$\frac{1}{\pi}\sum_{n=1}^{\infty}\frac{1}{n}\left[-\left[\sin\left(n\pi+\frac{n\pi\tau}{T}\right)-\sin\left(n\pi-\frac{n\pi\tau}{T}\right)\right]\cos\left(\frac{2n\pi t}{T}\right)-\right.$$

$$\left[\cos\left(n\pi-\frac{n\pi\tau}{T}\right)-\cos\left(n\pi+\frac{n\pi\tau}{T}\right)\right]\sin\left(\frac{2n\pi t}{T}\right)\right]=$$

$$\frac{1}{\pi}\sum_{n=1}^{\infty}\frac{1}{n}\left[\left[(-1)^n\sin\left(\frac{n\pi\tau}{T}\right)+(-1)^n\sin\left(\frac{n\pi\tau}{T}\right)\right]\right.$$

$$\cos\left(\frac{2n\pi t}{T}\right)-\left[(-1)^n\cos\left(\frac{n\pi\tau}{T}\right)-\right.$$

$$\left.(-1)^n\cos\left(\frac{n\pi\tau}{T}\right)\right]\sin\left(\frac{2n\pi t}{T}\right)\right]=$$

$$\frac{1}{\pi}\sum_{n=1}^{\infty}\frac{1}{n}\left[(-1)^n\left[\sin\left(\frac{n\pi\tau}{T}\right)+\sin\left(\frac{n\pi\tau}{T}\right)\right]\cos\left(\frac{2n\pi t}{T}\right)\right]=$$

$$\frac{2}{\pi}\sum_{n=1}^{\infty}\frac{1}{n}\left[(-1)^n\sin\left(\frac{n\pi\tau}{T}\right)\cos\left(\frac{2n\pi t}{T}\right)\right]=$$

$$-\left(-\frac{2}{\pi}\sum_{n=1}^{\infty}\frac{1}{n}[(-1)^n\sin\left(\frac{n\pi\tau}{T}\right)\cos\left(\frac{2n\pi t}{T}\right)]\right)=$$

$$-zcPulse_\tau(t).$$

Similarly, multiplying through by −1 gives:

$$pazPulseC_\tau(t) = -pazPulseL_{\left(\frac{T-\tau}{2}\right)}(t) - pazPulseR_{\left(\frac{T+\tau}{2}\right)}(t).$$

Thus the Center-anchored period-average-zero pulse of a given duty cycle can be represented as the negative sum of Left-anchored and Right-anchored period-average-zero pulses, each having half the given duty cycle. Together with the inversion relation between Left-anchored and Right-anchored period-average-zero pulses obtained earlier permits the following:

$$pazPulseL_\tau(t) = -pazPulseR_\tau(t)$$

these establish relationships among the various types of output signals that can be produced by the exemplary circuit of FIG. 14.

Canonical Form of "Through-Zero" Pulse-Width Modulation

Additionally, if the shifted ramp phase is modulated, the width of the paz-pulse is modulated as well in a linear relationship. If the phase-shift is taken to be a linear function of time, the phase-shifted ramp becomes a frequency-shifted ramp. The resulting paz-pulse then becomes a zero-d.c. version of "through-zero pulse-width modulation" initially introduced and developed in the above mentioned article by Ludwig and Hutchins, "A New Look at Pulse Width Modulation, Part 3," Electronotes, Vol. 12 No. 118, October 1980. Here a briefer development of that concept will be provided, using the period-average-zero.

From earlier we have the Fourier series for a period-average-zero Center-anchored periodic pulse waveform as:

$$pazPulseC_\tau(t) = -\frac{2}{\pi}\sum_{n=1}^{\infty}\frac{1}{n}\left[(-1)^n\sin\left(\frac{n\pi\tau}{T}\right)\cos\left(\frac{2n\pi t}{T}\right)\right]$$

With reference to FIG. 1c and its period-average-zero analogs depicted in FIGS. 10a-10f, the pulse width clearly becomes proportionally smaller as t approaches zero, and the pulse itself becomes zero when $\tau=0$. The latter can be seen analytically, since $\sin(0)=0$:

$$pazPulseC_0(t) = -\frac{2}{\pi}\sum_{n=1}^{\infty}\frac{1}{n}\left[(-1)^n\sin\left(\frac{n\pi 0}{T}\right)\cos\left(\frac{2n\pi t}{T}\right)\right] = 0$$

Now to develop the concept of a "negative" pulse width for engineering purposes and in relation to various embodiments, let 1" formally become negative. One way to explore this would be to replace 1" with −t and let 1" be positive. Since $$\sin(-x)=-\sin(x)$$

one obtains:

$$pazPulseC_{-\tau}(t) = -\frac{2}{\pi}\sum_{n=1}^{\infty}\frac{1}{n}\left[(-1)^n\sin\left(\frac{-n\pi\tau}{T}\right)\cos\left(\frac{2n\pi t}{T}\right)\right]$$

$$= \frac{2}{\pi}\sum_{n=1}^{\infty}\frac{1}{n}\left[(-1)^n\sin\left(\frac{n\pi\tau}{T}\right)\cos\left(\frac{2n\pi t}{T}\right)\right]$$

$$= -pazPulseC_\tau(t).$$

Thus, for positive $\tau$, a period-average-zero Center-anchored pulse with negative width $-\tau$ is a period-average-zero Center-anchored pulse with positive width $\tau$ multiplied by $-\tau$.

Figure 18:
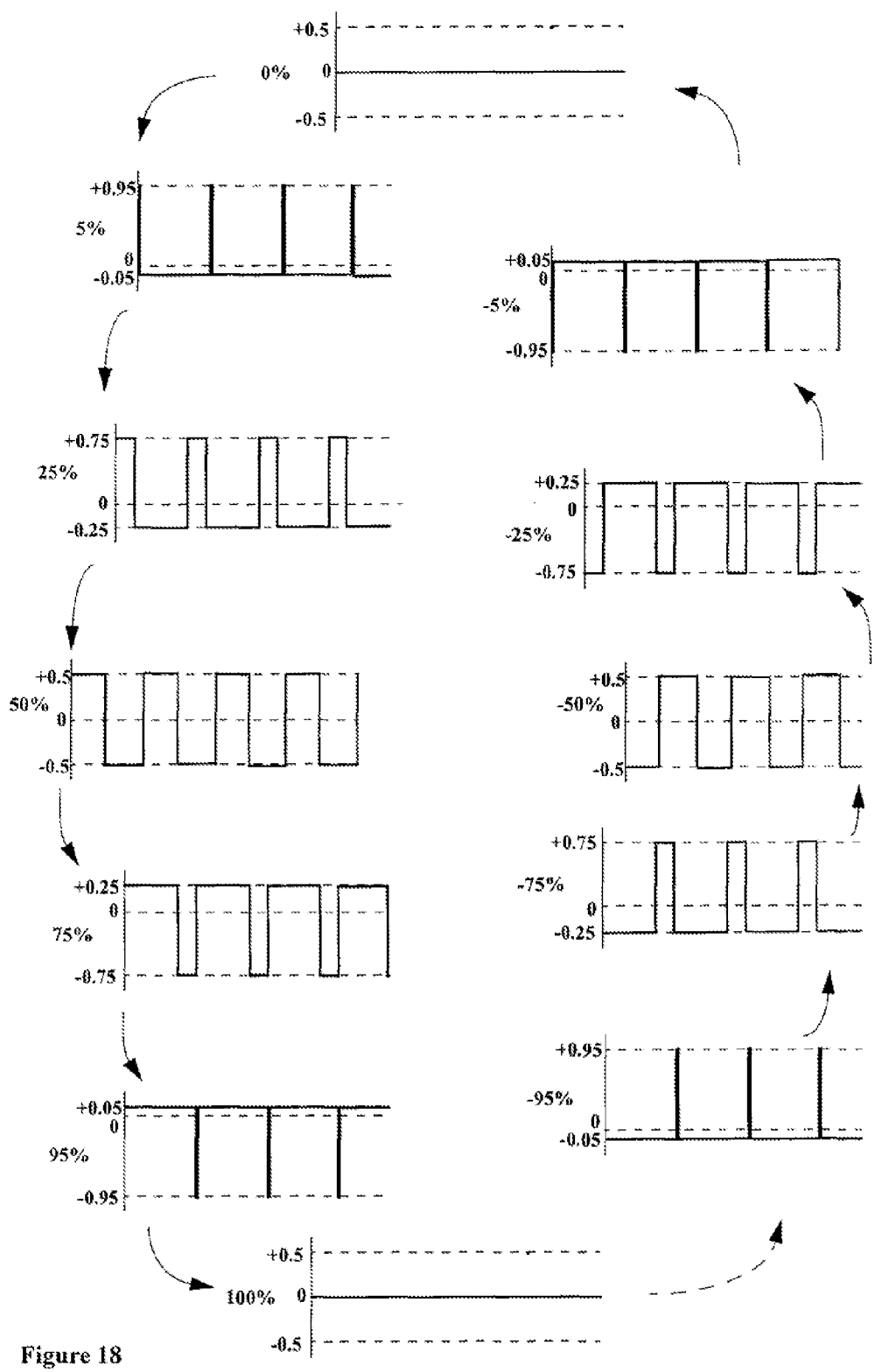
FIG. 18 depicts an exemplary demonstration of "through-zero" pulse width modulation by illustrating exemplary steps in the evolution of a zero d.c. term pulse width modulated waveform beginning with a case with a negative 95% pulse width through 0% pulse width to a positive 95% pulse width and then on to 100% pulse width.
Figures 22A, 22B, 22C, 22D, 22E:
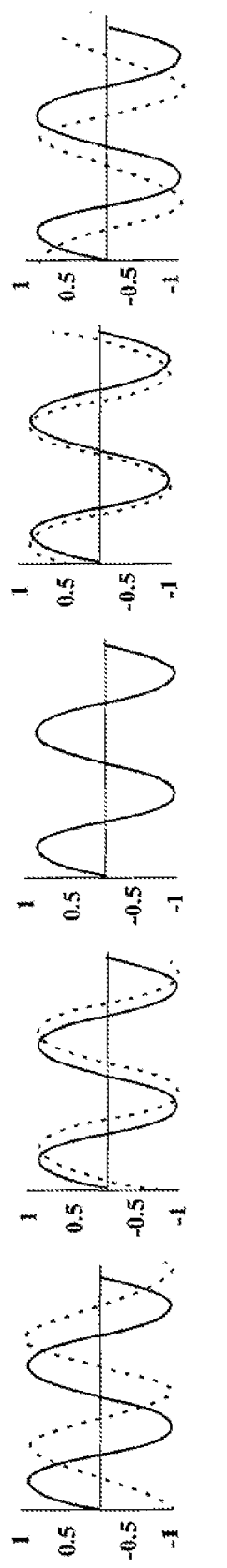
FIGS. 22a-22e depict pairs of sine waves relationship similar to that of FIGS. 21a-21e and the effects of adding the sine wave to demonstrate additive beat frequency phenomena.

FIG. 18 demonstrates the evolution from −95% pulse width through 0% pulse width to 95% and then on to 100% pulse width. Since $$\sin(-n\pi)=-\sin(n\pi)=0$$

a pulse width of 100% and −100% are both zero, and thus interchangeable, as shown by the dashed-line arrow in FIG. 18. Since the term $$\sin\left(\frac{n\pi\tau}{T}\right)$$

is periodic in $\tau$ with period 2T, the cycle repeats periodically with period 200%.

In the above identified reference for the original treatment of "through-zero pulse-width modulation" handling the effects of a non-zero d.c. term resulted in a number of alternate definitions and examples of the phenomena. With this analysis it is clear that the underlying canonical process is best and most naturally defined in terms of period-average-zero pulse-width modulation. In accordance with the present disclosure, this canonical form will often be referred to as a "period-average-zero through-zero pulse-width modulation process."

Linear-Time Through-Zero Pulse-Width Modulation as Beat-Frequency Phenomena for Ramp Waveforms In another aspect, through-zero pulse-width modulation with its pulse width linearly increasing in time can be shown to be the difference between two periodic ramp waveforms of the same amplitude. This allows the creation of a direct analogy with the well-known "beat-frequency" phenomena associated with sine waves and in fact any two periodic waveforms of slightly different frequencies. In fact, when both periodic ramp waveforms of the same amplitude are subtracted from one another, even when they include equal d.c. terms, the period-average-zero through-zero pulse-width modulation process results. This is graphically demonstrated in FIGS. 19a and 19b. Note the case where the top ramp waveform leads the bottom ramp waveform, for example as shown in FIG. 19a, produces a period-average-zero pulse waveform that is −1 times the period-average-zero pulse waveform produced by the case where bottom ramp waveform leads the top ramp waveform, such as that which is depicted in FIG. 19b.

The result can also be shown by direct calculation, revealing quantitative structures employed by various embodiments, some of which are described in more detail below. Because of cumbersome calculation artifacts relating to careful accounting of the discontinuity occurring at a period boundary, it is typically awkward to work with the pazUpRamp(t) or pazDownRamp(t) Fourier series:

$$pazUpRamp(t) = -\frac{1}{\pi}\sum_{n=1}^{\infty}\frac{1}{n}\sin\left(\frac{2n\pi t}{T}\right)$$

$$pazDownRamp(t) = \frac{1}{\pi}\sum_{n=1}^{\infty}\frac{1}{n}\sin\left(\frac{2n\pi t}{T}\right)$$

The same or similar result can be obtained far more directly by using a time-shifted version of the ramp waveform that puts the discontinuity at the center of the period, such as for the up-going time-shifted ramp shown in FIG. 19c. This waveform will be referred to herein as zcUpSaw(t). The Fourier series may be calculated directly from the Fourier series for zcUpRamp(t) as proof that pazUpSaw(t) can be represented as $$zcUpRamp\left(t+\frac{T}{2}\right)$$

as shown below:

$$zcUpRamp\left(t+\frac{T}{2}\right) = -\frac{1}{\pi}\sum_{n=1}^{\infty}\frac{1}{n}\sin\left(\frac{2n\pi\left(t+\frac{T}{2}\right)}{T}\right)$$

$$= -\frac{1}{\pi}\sum_{n=1}^{\infty}\frac{1}{n}\sin\left(\frac{2n\pi t}{T}+n\pi\right)$$

$$= -\frac{1}{\pi}\sum_{n=1}^{\infty}\frac{1}{n}\left[\sin\left(\frac{2n\pi t}{T}\right)\cos(n\pi)+\right.$$

$$\cos\left(\frac{2n\pi t}{T}\right)\sin(n\pi)\Big]$$

$$= -\frac{1}{\pi}\sum_{n=1}^{\infty}\frac{1}{n}\left[\sin\left(\frac{2n\pi t}{T}\right)(-1)^n + 0\right]$$

$$= -\frac{1}{\pi}\sum_{n=1}^{\infty}\frac{(-1)^n}{n}\sin\left(\frac{2n\pi}{T}\right)$$

giving:

$$zcUpSaw(t) = -\frac{1}{\pi}\sum_{n=1}^{\infty}\frac{(-1)^n}{n}\sin\left(\frac{2n\pi t}{T}\right)$$

Subtracting one instance of this periodic at relative frequency!; from another instance of this periodic at a different relative frequency 1; gives:

$$zcUpSaw(f_1t) - zcUpSaw(f_2t) = -\frac{1}{\pi}\sum_{n=1}^{\infty}\frac{(-1)^n}{n}\sin\left(\frac{n\pi f_1 t}{T}\right) +$$

$$\frac{1}{\pi}\sum_{n=1}^{\infty}\frac{1}{n}\sin\left(\frac{n\pi f_2 t}{T}\right)$$

$$= -\frac{1}{\pi}\sum_{n=1}^{\infty}\frac{(-1)^n}{n}\left[\sin\left(\frac{n\pi f_1 t}{T}\right) - \sin\left(\frac{n\pi f_2 t}{T}\right)\right]$$

Applying Prosthaphaeresis formula for the difference of two sine functions, one obtains:

$$= -\frac{1}{\pi}\sum_{n=1}^{\infty}\frac{(-1)^n}{n}\left[2\cos\left[\frac{1}{2}\left(\frac{2n\pi f_1 t}{T} + \frac{2n\pi f_2 t}{T}\right)\right]\right.$$

$$\left.\sin\left[\frac{1}{2}\left(\frac{2n\pi f_1 t}{T} - \frac{2n\pi f_2 t}{T}\right)\right]\right]$$

$$= -\frac{1}{\pi}\sum_{n=1}^{\infty}\frac{(-1)^n}{n}\left[2\cos\left[\frac{1}{2}\left(\frac{2n\pi t}{T}\right)(f_1+f_2)\right]\sin\left[\frac{1}{2}\left(\frac{2n\pi t}{T}\right)(f_1-f_2)\right]\right]$$

$$= -\frac{2}{\pi}\sum_{n=1}^{\infty}\frac{(-1)^n}{n}\left[\cos\left[\frac{f_1 n\pi t}{T} + \frac{f_2 n\pi t}{T}\right]\sin\left[\frac{f_1 n\pi t}{T} - \frac{f_2 n\pi t}{T}\right]\right]$$

$$= -\frac{2}{\pi}\sum_{n=1}^{\infty}\frac{(-1)^n}{n}\left[\cos\left[\frac{n\pi(f_1+f_2)t}{T}\right]\sin\left[\frac{n\pi(f_1-f_2)t}{T}\right]\right]$$

Comparing with the Fourier series for the period-average-zero Center-anchored periodic pulse waveform:

$$pazPulseC_\tau(t) = -\frac{2}{\pi}\sum_{n=1}^{\infty}\frac{1}{n}\left[(-1)^n\sin\left(\frac{n\pi\tau}{T}\right)\cos\left(\frac{2n\pi t}{T}\right)\right]$$

One may increase the frequency by multiplying time t by frequency~:

$$pazPulseC_\tau(tf) = -\frac{2}{\pi}\sum_{n=1}^{\infty}\frac{1}{n}\left[(-1)^n\sin\left(\frac{n\pi\tau}{T}\right)\cos\left(\frac{2n\pi tf}{T}\right)\right]$$

and thus identify:

$$f = \frac{(f_1+f_2)}{2}$$

$$\tau = (f_1-f_2)t$$

It is additionally noted that the two ramp waveforms have identical d.c. offset terms, these are exactly cancelled when these two ramp waveforms are subtracted one from the other. Thus the difference between the ramp waveforms may be characterized as a period-average-zero periodic pulse waveform, and in fact is the period-average-zero through-zero pulse-width modulation process with a frequency that is the average of frequency $f_1$ and frequency $f_2$ wherein the pulse width increases linearly in time at a rate corresponding to the difference between frequency $f_1$ and frequency $f_2$ Because the through-zero pulse-width modulation process depicted in FIG. 18, is periodic in τ with period 2T, the through-zero pulse-width modulation process here will have period $2(f_1-f_2)$.

Referring to FIG. 18, it is noted that the ear is insensitive to a fixed multiplication by −1, so when the difference $2(f_1-f_2)$ is less than approximately 16-20 Hz, the ear will hear only the pattern of energy variation, or equivalently the pattern of the absolute value, thus perceived with a frequency of half that of $2(f_1-f_2)$ namely $|f_1-f_2|$ or the difference between the frequencies of the two periodic ramp waveforms. As would now be clear to one skilled in the art, this is directly analogous to the beat frequency process of two arbitrary waveforms, albeit here specialized to the difference between two ramp waveforms in a manner applicable to an embodiment of the present invention.

FIGS. 20a-20e depict exemplary generation of period-average-zero through-zero pulse width modulation. In each of these figures, the ramp/sawtooth waveform drawn in dashed line is subtracted from the ramp/sawtooth waveform drawn in solid line to produce the pulse waveforms drawn beneath. As the dashed line waveform increasing approaches an alignment with the solid line waveform, the positive-valued duty cycle decreases towards zero, such as that shown in FIGS. 20a-20b. In the situation where the dashed line waveform is both the same frequency and in exact phase alignment with the solid line waveform, the duty cycle is zero. As the dashed line waveform moves forward beyond an alignment with the solid line waveform, the negative-valued duty cycle decreases away from zero, as shown in FIGS. 20a-20b. Note the period-average-zero displacement of the pulse waveform in FIGS. 20a-20e in agreement with the development utilized by this particular embodiment.

This may be compared to the beat frequency phenomena of a sine wave, depicted analogously in FIGS. 21a-21e. The sine wave beat frequency phenomena, unlike that for ramp/sawtooth waveforms, may be produced for added or subtracted sine waves, although these differ in the resultant phase behavior. In analogy with FIGS. 20a-20e, each of FIGS. 21a-21e depict the subtraction of the waveform drawn in dashed line from the waveform drawn in solid line to produce the waveform drawn beneath. The mathematical representation for the difference of two unit amplitude sine waves of relative frequencies $f_1$ and $f_2$ is given by:

$$\sin\left(\frac{2\pi f_1 t}{T}\right) - \sin\left(\frac{2\pi f_2 t}{T}\right)$$

Applying Prosthaphaeresis formula for the difference of two sine functions, one obtains:

$$\sin\left(\frac{2\pi f_1 t}{T}\right) - \sin\left(\frac{2\pi f_2 t}{T}\right) = 2\cos\left[\frac{1}{2}\left(\frac{2\pi f_1 t}{T} + \frac{2\pi f_2 t}{T}\right)\right]$$
$$\sin\left[\frac{1}{2}\left(\frac{2\pi f_1 t}{T} - \frac{2\pi f_2 t}{T}\right)\right]$$
$$= 2\cos\left[\frac{(f_1 + f_2)}{2}\left(\frac{2\pi t}{T}\right)\right]$$
$$\sin\left[\frac{(f_1 - f_2)}{2}\left(\frac{2\pi t}{T}\right)\right]$$

There are a number of direct analogies here:

- As with the period-average-zero through-zero pulse width modulation process depicted in FIGS. 20a-20e, there is a phase reversal as the sine waves move towards, through, and past coalignment.
- As with the period-average-zero through-zero pulse width modulation process depicted in FIG. 20c, when both sine waves are of the same frequency and in exact phase alignment there is cancellation as shown in FIG. 21c.
- Additionally, it is noted that the energy of the each difference waveform, the energy being proportional to the square of the time-integral of the difference waveform, decreases (FIGS. 20a-20b and 21a-21b) as the subtracted waveforms increasingly come towards being into alignment (FIGS. 20c and 21c) and increases again (FIGS. 20d-20e and 21d-21e) as they separate away from alignment.
- Further, the higher frequency term is again the average of the two frequencies, and the lower frequency term is half the difference of the two frequencies, just as in the period-average-zero through-zero pulse width modulation process.

These analogies are possible since this sine wave difference beat frequency phenomena effectively occurs term-by-term for each of the sine wave harmonics of the two ramp/sawtooth waveform Fourier series to create the period-average-zero through-zero pulse width modulation process assembled and defined earlier.

By way of commentary, it is noted that sine wave beat frequency phenomena is typically represented as the sum of two sine waves, i.e., $$\sin\left(\frac{2\pi f_1 t}{T}\right) + \sin\left(\frac{2\pi f_2 t}{T}\right)$$

The Prosthaphaeresis formula for the sum of two sine functions differs in an important way, namely in exchanging the role of sine and cosine:

$$\sin\left(\frac{2\pi f_1 t}{T}\right) + \sin\left(\frac{2\pi f_2 t}{T}\right) = 2\sin\left[\frac{1}{2}\left(\frac{2\pi f_1 t}{T} + \frac{2\pi f_2 t}{T}\right)\right]$$
$$\cos\left[\frac{1}{2}\left(\frac{2\pi f_1 t}{T} - \frac{2\pi f_2 t}{T}\right)\right]$$
$$= 2\sin\left[\frac{(f_1 + f_2)}{2}\left(\frac{2\pi t}{T}\right)\right]$$
$$\cos\left[\frac{(f_1 - f_2)}{2}\left(\frac{2\pi t}{T}\right)\right]$$

Thus the lower frequency, or beat-frequency, component is in the form of a cosine and the sine waves constructively add when both sine waves are of the same frequency and in exact phase alignment. This beat frequency phenomena emergent from the addition of two sine waves is depicted in FIGS. 22a-22e for sine wave relationship similar to that of FIGS. 21a-21e to demonstrate the distinguished behavior.

Variable-Symmetry Triangle Waveforms as Time-Integrals of Period-Average-Zero Pulse Waveforms Because period-average-zero periodic pulse waveforms have zero d.c. component in each period, their time integrals will as well. This includes any number of traditional integrations (first time-integral, double time-integral, triple time-integral, and the like) as well as all (appropriately defined) fractional integrals of order (for orders comprising non-negative real part). For a treatment of fractional integrals of periodic waveforms, see for example *The Fractional Calculus: Theory and Applications of Differentiation and Integration to Arbitrary Order* by Keith B. Oldham and Jerome Spanier, 1974 (recently reprinted by Dover) and Ludwig, "Uniform Variable Slope Processes," Electronotes Vol.12, No. 109, January 1980.

Figure 23A:
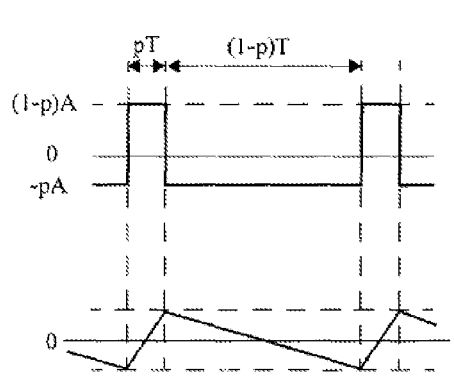
Figure 23B:
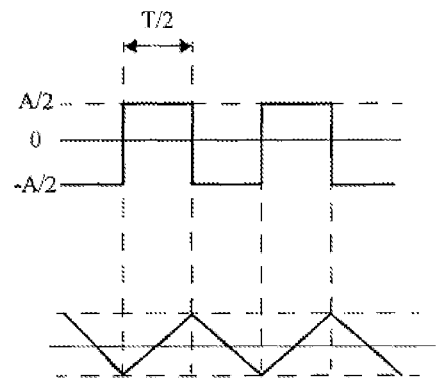
Figure 23C:
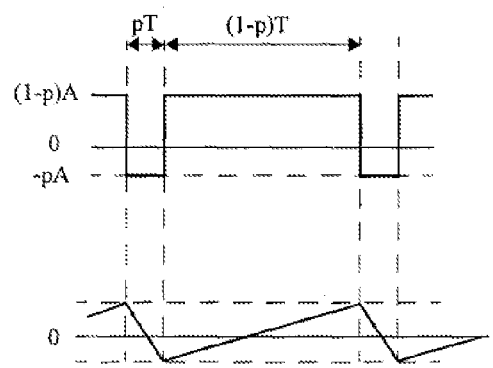

In particular, the first time-integral of a pulse waveform with zero d.c. term and variable symmetry is a triangle wave of zero d.c. term and variable symmetry. Three examples are provided in FIGS. 23a-23c. Of these, the case of a symmetric ("square") pulse waveform and its time-integral, the symmetric triangle, are shown in FIG. 23b. FIG. 23c illustrates how the time-integral of the negative of the asymmetric pulse waveform of FIG. 23a has the time integral of an asymmetric triangle waveform with opposite slopes of that of the asymmetric triangle waveform of the original asymmetric pulse waveform of FIG. 23a.

Figure 24:
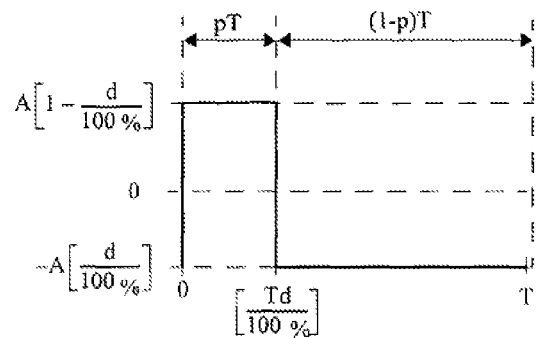
FIG. 24 depicts a general pulse waveform with zero d.c. term as provided for by embodiments of the invention.
Figure 25:
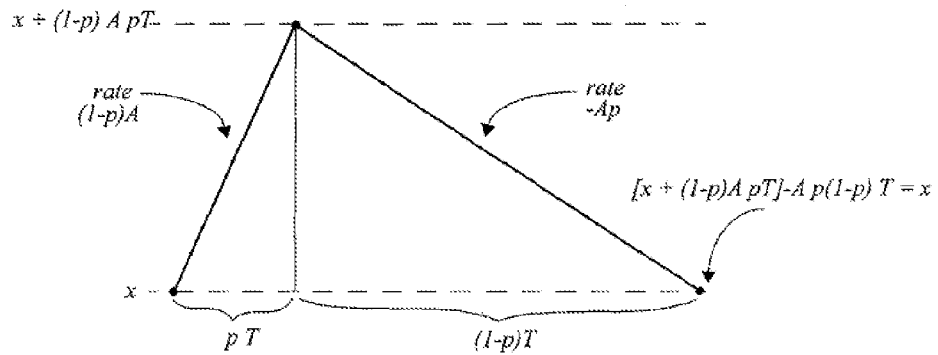
FIG. 25 depicts the time-integral of the waveform of FIG. 24.

FIGS. 24 and 25 explore the relationships in more detail. FIG. 24 depicts a general pulse waveform with zero d.c. term, in accordance with various embodiments described earlier, having amplitude A, period T, and an "asymmetry proportion" p (relating to the duty cycle d) according to:

$$p = \frac{d}{100\%}$$

FIG. 25 depicts the time-integral of this periodic waveform. Starting at an amplitude value x, the time integral of the first (here positive-valued) portion of the pulse waveform with asymmetry proportion p amounts to a line segment increasing at rate $(1-p)A$ for a time interval of Tp. At the point in time where the pulse waveform changes value, the attained amplitude value is:

$$x+(1-p)ApT$$

For the remainder of the time period, the time integral of the last (here negative-valued) portion of the pulse waveform p amounts to a line segment decreasing at rate −Ap for a time interval of Tp. At the end of the period, the attained amplitude value is the sum of the amplitude value at the start of decent, such that:

$$[x+(1-p)ApT]$$

plus the change from the time integral of the second portion of the waveform, namely the rate of decrease −Ap times the duration (1−p)A, or $$[-Ap(1-p)T].$$

Figure 26:
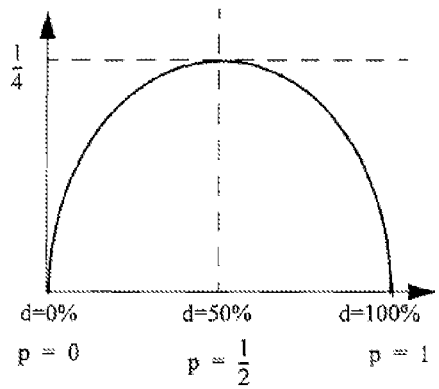
FIG. 26 depicts the behavior of the quadratic term p(1−p) which is the pulse width related factor in the amplitude of the waveform of FIG. 25. This term has a maximum value of ¼ attained when p=½ (i.e., at 50% duty cycle).

This difference is:

$$[x+(1-p)ApT]+[-AP(1-p)T]=x$$

thus returning the waveform to its original amplitude value of x. Therefore the resultant asymmetric triangle waveform thus has an amplitude of:

$$[p(1-p)AT].$$

which depends linearly on the pulse waveform amplitude, linearly on the pulse waveform period, and quadratically on the pulse waveform duty cycle. Since a periodic waveform period is the reciprocal of its frequency, the amplitude of the time-integral of the pulse waveform decreases in inverse proportion to frequency, as one skilled in the art would expect from the viewpoint of a term-by-term integration of the terms of the pulse waveform's Fourier series. FIG. 26 depicts the behavior of the quadratic term p(1−p) which has a maximum value of ¼ attained when p=½ (i.e., at 50% duty cycle).

Referring to FIG. 25, the time-integral "area" under the first triangular region may be represented as:

$$pT(1-p)A$$

while the time-integral "area" under the second triangular region may be represented as:

$$[-Ap(1-p)T].$$

Figure 27:
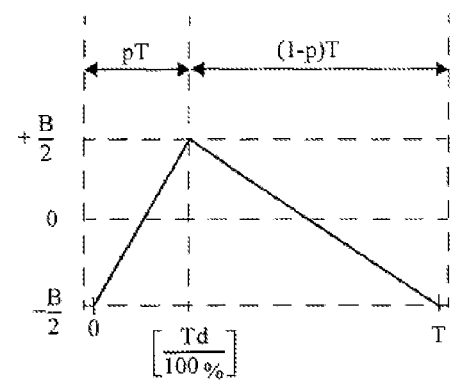
FIG. 27 shows how if an exemplary asymmetric triangle waveform has an amplitude of B, it is amplitude-centered around zero with extremal values of $$+\frac{B}{2} \text{ and } -\frac{B}{2}.$$

The sum of these is zero for all values of 0<p<1, i.e. for all duty cycle values between (though not formally including) 0% and 100%. This confirms the periodic time-integral asymmetric triangle waveforms inherently have a zero d.c. average for each period independent of duty cycle. As a result, if the asymmetric triangle waveform has an amplitude of B, it will be amplitude-centered around zero with extremal values of:

$$+\frac{B}{2} \text{ and } -\frac{B}{2}$$

as shown in FIG. 27.

Figure 28:
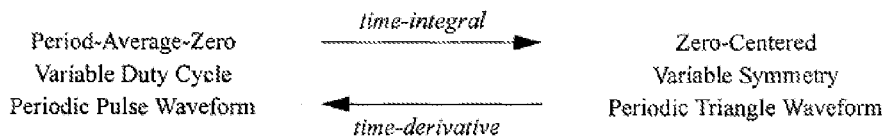
FIG. 28 shows the relationships between zero-centered asymmetric pulse waveforms and period-average-zero variable duty cycle periodic pulse waveforms via time-differentiation and time-integration.

Since time-differentiation is the inverse operation of time-integration, it is therefore provided herein for period-average-zero variable duty cycle periodic pulse waveforms to be created by the time-differentiation of zero-centered asymmetric periodic triangle waveforms. This is illustrated in FIG. 28, along with the creation of zero-centered asymmetric triangle waveforms from the time-integral of period-aver age-zero variable duty cycle periodic pulse waveforms described earlier.

Further embodiments provide for this type of time-integration and time-differentiation transformations to be used to relate period-average-zero variable duty cycle periodic pulse waveforms with higher order time-integrals and time-derivatives (2nd order, 3rd order, etc.) as well as fractional-order time-integrals and time-derivatives. As to this, it is noted that the time-integration and time-differentiation transformations depicted in FIG. 28 may be of any order, either integer-valued order or fractional-order, wherein the order value comprises non-negative real part. Examples of the significance of these concepts include:

period-average-zero variable duty cycle periodic pulse waveforms have no constant component, and thus all integrals of all integer-valued order or (appropriately defined) fractional-order (wherein the order value comprises non-negative real part, are zero-centered), and many physical phenomena are rendered via or observed through other processes that involve integer-valued order or fractional-order time-integration and time-differentiation transformations.

The use of these types of relationships is explicitly provided for by the present disclosure.

Time-Integrals of Period-Aver Age-Zero Through-Zero Pulse-Width Modulation Waveforms as "Through-Zero Variable-Symmetry Triangle Waveforms"

Because of the "discrete event" nature of period-average-zero pulse waveforms, the time-integral of a time varying sequence of period-average-zero through-zero pulse width modulated waveforms, such as the sequence depicted in FIG. 18, creates a sequence of corresponding zero-centered asymmetric periodic triangle waveforms. As a result, a corresponding cycle of zero-centered asymmetry-modulated triangle waveforms are provided. Such a zero-centered asymmetry-modulated triangle waveform process cycle (with fewer examples than provided in FIG. 18) is provided in FIG. 29. Note that as the asymmetry reaches the extremes that would in the limit create an upward or downward ramp/sawtooth waveform, the amplitude will shrink to zero in accordance with the multiplicative factor plotted in FIG. 26. After attaining zero amplitude, the zero-centered asymmetry-modulated triangle waveform amplitude will grow and shrink again in accordance with the variation in the asymmetry proportion p, but the waveform will be multiplied by −1.

Figure 29:
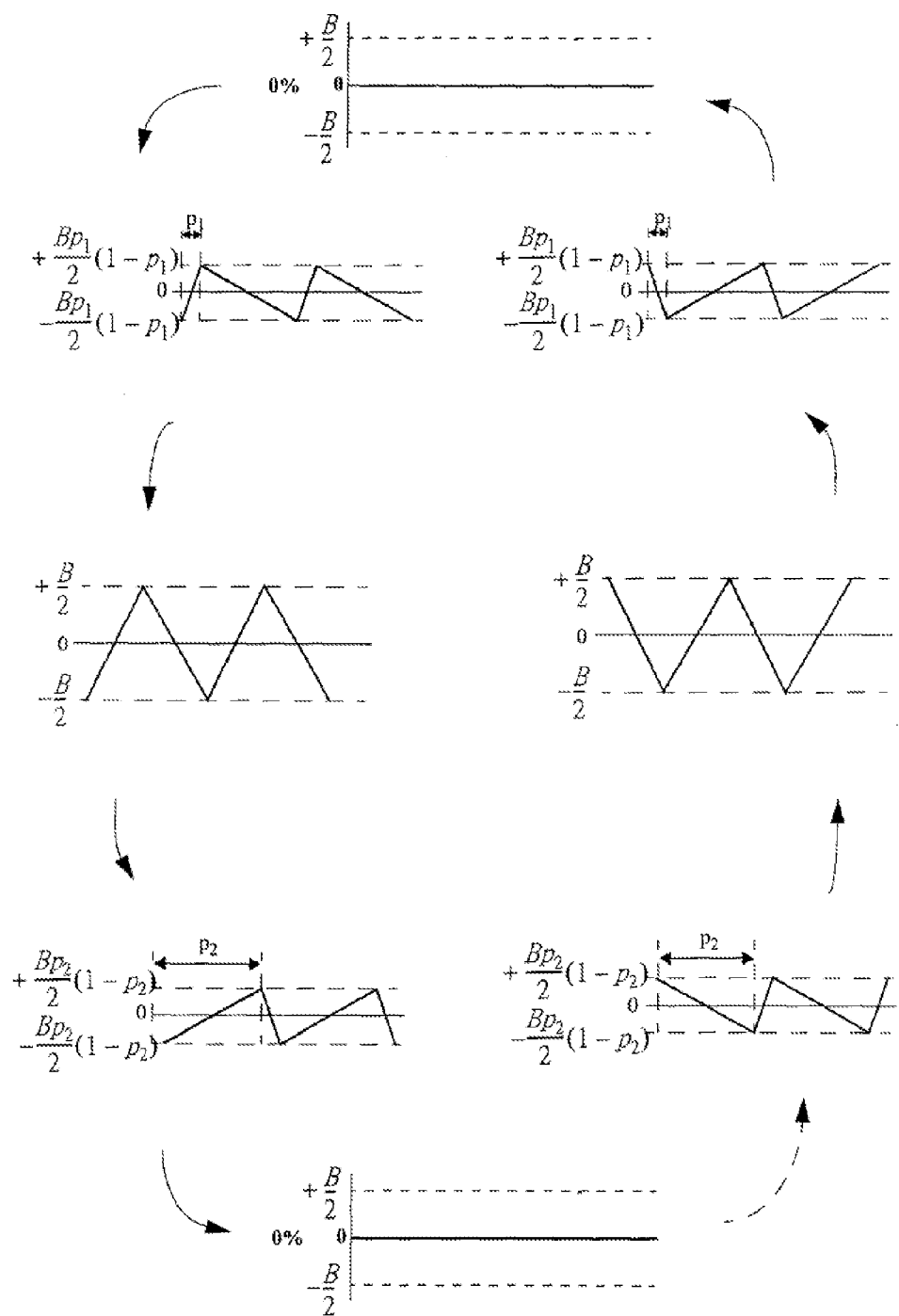
FIG. 29 depicts an exemplary zero-centered asymmetry-modulated triangle waveform process cycle similar to that provided in FIG. 18.

In the above, the transformations depicted in FIG. 28 link the cycles as depicted in FIG. 18 with the cycles as depicted in FIG. 29. It is understood that since the time-integration and time-differentiation transformations to be used to relate period-average-zero variable duty cycle periodic pulse waveforms with higher order time-integrals and time-derivatives ($2^{nd}$ order, $3^{rd}$ order, etc.) as well as fractional-order time-integrals and time-derivatives (wherein the order value comprises non-negative real part), similar cycles may be constructed by time-integration the FIG. 18 cycle of any order, either integer-valued order or (appropriately defined) fractional-order, wherein the order value comprises non-negative real part.

In general, all such time-integrals of the period-average-zero variable duty cycle periodic pulse waveforms in FIG. 18 cycle have no constant component, and thus all integrals of all integer-valued order or fractional-order (wherein the order value comprises non-negative real part, are zero-centered). In that many physical phenomena is rendered via or observed through other processes that involve integer-valued order or fractional-order time-integration and time-differentiation transformations, the use of these types of cycles is explicitly provided for by the invention.

Employing Period-Aver age-Zero Through-Zero Pulse-Width Modulation Waveforms to Measurement Applications Since the period-average-zero through-zero pulse width modulated waveform process is the result of the difference between two ramp or sawtooth waveforms, an arrangement involving various embodiments described above may be used in instrumentation for the measurement of a phase angle of an exogenous system or phenomena. Such measurement methods and systems are also provided for by the present disclosure.

Employing Through-Zero Asymmetry-Modulated Triangle Waveforms to Measurement Applications Since a zero-centered asymmetry-modulated triangle waveform process and a period-average-zero through-zero pulse width modulated waveform process are usually related by time-integration and time-differentiation, an arrangement involving the various embodiments of the invention described above may be used in instrumentation for the measurement of a phase angle of an exogenous system or phenomena. Such measurement methods and systems are also provided herein.

While the invention has been described in detail with reference to disclosed embodiments, various modifications within the scope of the invention will be apparent to those of ordinary skill in this technological field. It is to be appreciated that features described with respect to one embodiment typically may be applied to other embodiments. Therefore, the invention properly is to be construed with reference to the claims.

I claim:

1. A method comprising:
   producing, by a comparator, a comparison output signal based upon a comparison of a periodic signal and a reference signal; and
   subtracting a DC value from the comparison output signal to produce a periodic output signal having an average value that is substantially equal to zero during a period of the output signal, wherein the DC value is based on the reference signal.

2. The method as recited in claim 1, wherein the DC value is proportional to a pulse width effect of the reference signal.

3. The method as recited in claim 2, wherein the pulse width effect comprises an affine function and the periodic signal comprises a ramp waveform.

4. The method as recited in claim 2, wherein the pulse width effect comprises an affine function and the periodic signal comprises a triangle waveform.

5. The method as recited in claim 2, wherein the pulse width effect comprises a linear function and the periodic signal comprises a triangle waveform.

6. The method as recited in claim 2, wherein the pulse width effect comprises an arcsine function and the periodic signal comprises a sine wave.

7. The method as recited in claim 1, wherein the comparison output signal comprises a pulse waveform and during a given period, a pulse width of the pulse waveform is proportional to an amplitude of the reference signal.

8. The method as recited in claim 1, wherein the reference signal comprises a DC reference voltage whose amplitude is fixed within a given period of the periodic signal.

9. The method as recited in claim 1, wherein an amplitude of the periodic output signal is equal and opposite in polarity during different portions of a given period.

10. An apparatus comprising:
    a comparator unit configured to compare a periodic signal and a reference signal to produce a comparison output signal,
    a function unit coupled to the reference signal and configured to produce an offset signal based on the reference signal; and
    a summing unit coupled to an output of the comparator unit and configured to combine the offset signal with the comparison output signal to produce a periodic output signal.

11. The apparatus as recited in claim 10, wherein the function unit is configured to produce the offset signal based on a pulse width effect of the reference signal, and wherein the summing unit is configured to combine the offset signal with the comparison output signal by subtracting the offset signal from the comparison output signal.

12. The apparatus as recited in claim 11, wherein the pulse width effect comprises an affine function and the periodic signal comprises a ramp waveform.

13. The apparatus as recited in claim 11, wherein the pulse width effect comprises an affine function and the periodic signal comprises a triangle waveform.

14. The apparatus as recited in claim 11, wherein the pulse width effect comprises a linear function and the periodic signal comprises a triangle waveform.

15. The apparatus as recited in claim 11, wherein the pulse width effect comprises an arcsine function and the periodic signal comprises a sine wave.

16. The apparatus as recited in claim 10, wherein the comparison output signal comprises a pulse waveform and during a given period, a pulse width of the pulse waveform is proportional to an amplitude of the reference signal.

17. The apparatus as recited in claim 10, wherein the reference signal comprises a DC reference voltage whose amplitude is fixed within a given period of the periodic signal.

18. A non-transitory computer readable storage medium including program instructions executable by a processor to:
    produce a comparison output signal based upon a comparison of a periodic signal and a reference signal;produce a DC value that is a function of the reference signal; and
    subtract the DC value from the comparison output signal to produce a periodic output signal having an average value that is substantially equal to zero during a period.

19. The non-transitory computer readable storage medium as recited in claim 18, wherein the DC value is proportional to a pulse width effect of the reference signal.

20. The non-transitory computer readable storage medium as recited in claim 19, wherein the pulse width effect comprises an affine function and the periodic signal comprises a ramp waveform.

21. The non-transitory computer readable storage medium as recited in claim 19, wherein the pulse width effect comprises an affine function and the periodic signal comprises a triangle waveform.

22. The non-transitory computer readable storage medium as recited in claim 19, wherein the pulse width effect comprises a linear function and the periodic signal comprises a triangle waveform.

23. The non-transitory computer readable storage medium as recited in claim 19, wherein the pulse width effect comprises an arcsine function and the periodic signal comprises a sine wave.

24. The non-transitory computer readable storage medium as recited in claim 18, wherein the comparison output signal comprises a pulse waveform and during a given period, a pulse width of the pulse waveform is proportional to an amplitude of the reference signal.

25. The non-transitory computer readable storage medium as recited in claim 18, wherein the reference signal comprises a DC reference voltage whose amplitude is fixed within a given period of the periodic signal.

* * * * *

UNITED STATES PATENT AND TRADEMARK OFFICE
CERTIFICATE OF CORRECTION

PATENT NO. : 8,531,251 B2
APPLICATION NO. : 12/941379
DATED : September 10, 2013
INVENTOR(S) : Ludwig It is certified that error appears in the above-identified patent and that said Letters Patent is hereby corrected as shown below:

On the Title Page, Item (56), under "OTHER PUBLICATIONS", in Column 2, Line 3, delete "Scans-00158551.ht- ml," and insert -- Scans-00158551.html, --, therefor.

In the Specifications

In Column 2, Line 23, delete "depicts" and insert -- depict --, therefor.

In Column 3, Line 19, delete "depicts" and insert -- depict --, therefor.

In Column 3, Line 45, delete "depicts" and insert -- depict --, therefor.

In Column 11, Line 27, delete "off'" and insert -- off' --, therefor.

In Column 11, Line 61, delete "etc.)" and insert -- etc.,) --, therefor.

In Column 16, Line 36, delete "$(A_{max} - \textit{offset}) - (A_{min} - \textit{offset}) = (A_{max} - A_{min}$" and insert -- $(A_{max} - \textit{offset}) - (A_{min} - \textit{offset}) = (A_{max} - A_{min})$ --, therefor.

In Column 20, Line 26, delete "variable t" and insert -- variable $\tau$ --, therefor.

In Column 23, Line 28, delete "10d-1 Of" and insert -- 10d-10f --, therefor.

Signed and Sealed this
Twentieth Day of May, 2014

Michelle K. Lee
*Deputy Director of the United States Patent and Trademark Office*

CERTIFICATE OF CORRECTION (continued)
U.S. Pat. No. 8,531,251 B2

In Column 28, Lines 56-65, delete "
$$[zcUpRamp(t)+h]+pazPulseL_\tau(t)=[zcUpRamp(t-\tau)+h]$$
$$[zcUpRamp(t)+h]-pazPulseR_\tau(t)=[zcUpRamp(t-\tau)+h]$$
$$[zcDownRamp(t)+h]+pazPulseR_\tau(t)=[zcDownRamp(t-\tau)+h]$$
$$[zcDownRamp(t)+h]-pazPulseL_\tau(t)=[zcDownRamp(t-\tau)+h]$$
" and insert
-- 
$$A[zcUpRamp(t)+h]+A\,pazPulseL_\tau(t)=A[zcUpRamp(t-\tau)+h]$$
$$A[zcUpRamp(t)+h]-A\,pazPulseR_\tau(t)=A[zcUpRamp(t-\tau)+h]$$
$$A[zcDownRamp(t)+h]+A\,pazPulseR_\tau(t)=A[zcDownRamp(t-\tau)+h]$$
$$A[zcDownRamp(t)+h]-A\,pazPulseL_\tau(t)=A[zcDownRamp(t-\tau)+h]$$
--, therefor.

In Column 29, Line 31, delete "aver age-zero" and insert -- average-zero --, therefor.

In Column 36, Line 2, delete "Period-Aver age-Zero" and insert -- Period-Average-Zero --, therefor.

In Column 37, Line 35, delete "period-aver age-zero" and insert -- period-average-zero --, therefor.

In Column 37, Line 60, delete "Period-Aver Age-Zero" and insert -- Period-Average-Zero --, therefor.

In Column 38, Line 39, delete "Period-Aver age-Zero" and insert -- Period-Average-Zero --, therefor.